United States Patent
Wang et al.

(10) Patent No.: US 10,269,628 B2
(45) Date of Patent: *Apr. 23, 2019

(54) FINFET LOW RESISTIVITY CONTACT FORMATION METHOD

(71) Applicant: Taiwan Semiconductor Manufacturing Company, Ltd., Hsinchu (TW)

(72) Inventors: Sung-Li Wang, Zhubei (TW); Ding-Kang Shih, New Taipei (TW); Chin-Hsiang Lin, Hsinchu (TW); Sey-Ping Sun, Hsinchu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/444,060

(22) Filed: Feb. 27, 2017

(65) Prior Publication Data

US 2017/0170061 A1 Jun. 15, 2017

Related U.S. Application Data

(60) Continuation of application No. 14/752,402, filed on Jun. 26, 2015, now Pat. No. 9,589,838, which is a
(Continued)

(51) Int. Cl.
*H01L 29/76* (2006.01)
*H01L 21/768* (2006.01)
(Continued)

(52) U.S. Cl.
CPC ...... *H01L 21/76856* (2013.01); *H01L 21/285* (2013.01); *H01L 21/76802* (2013.01);
(Continued)

(58) Field of Classification Search
CPC .......... H01L 21/823814; H01L 29/665; H01L 29/66636; H01L 29/7848; H01L 21/8238;
(Continued)

(56) References Cited

U.S. PATENT DOCUMENTS 5,262,719 A 11/1993 Magdo
6,521,956 B1 2/2003 Lee
(Continued)

FOREIGN PATENT DOCUMENTS

KR 20000027908 5/2000
KR 20100088905 8/2010
(Continued)

OTHER PUBLICATIONS

Japanese Office Action and English Translation, Application No. 2012-123100, 4 pages.
(Continued)

*Primary Examiner* — Theresa T Doan
(74) *Attorney, Agent, or Firm* — Slater Matsil, LLP

(57) ABSTRACT

A contact structure of a semiconductor device is provided. The contact structure for a semiconductor device comprises a substrate comprising a major surface and a trench below the major surface; a strained material filling the trench, wherein a lattice constant of the strained material is different from a lattice constant of the substrate, and wherein a surface of the strained material has received a passivation treatment; an inter-layer dielectric (ILD) layer having an opening over the strained material, wherein the opening comprises dielectric sidewalls and a strained material bottom; a dielectric layer coating the sidewalls and bottom of the opening, wherein the dielectric layer has a thickness ranging from 1 nm to 10 nm; a metal barrier coating an opening of the dielectric layer; and a metal layer filling a coated opening of the dielectric layer.

20 Claims, 28 Drawing Sheets

Related U.S. Application Data division of application No. 13/629,109, filed on Sep. 27, 2012, now Pat. No. 9,105,490, which is a continuation of application No. 15/058,344, filed on Mar. 2, 2016, which is a division of application No. 14/491,848, filed on Sep. 19, 2014, now Pat. No. 9,287,138, which is a continuation-in-part of application No. 13/629,109, filed on Sep. 27, 2012, now Pat. No. 9,105,490.

(51) Int. Cl.
*H01L 29/06* (2006.01)
*H01L 23/485* (2006.01)
*H01L 29/417* (2006.01)
*H01L 29/66* (2006.01)
*H01L 29/78* (2006.01)
*H01L 21/285* (2006.01)
*H01L 21/02* (2006.01)

(52) U.S. Cl.
CPC .. *H01L 21/76831* (2013.01); *H01L 21/76843* (2013.01); *H01L 21/76888* (2013.01); *H01L 23/485* (2013.01); *H01L 29/0684* (2013.01); *H01L 29/41783* (2013.01); *H01L 29/41791* (2013.01); *H01L 29/66636* (2013.01); *H01L 29/66795* (2013.01); *H01L 29/7848* (2013.01); *H01L 29/7851* (2013.01); *H01L 21/0262* (2013.01); *H01L 21/02532* (2013.01); *H01L 21/02579* (2013.01); *H01L 21/02639* (2013.01); *H01L 2029/7858* (2013.01); *H01L 2924/0002* (2013.01)

(58) Field of Classification Search
CPC .......... H01L 29/7846; H01L 21/02532; H01L 21/28525; H01L 21/31616
USPC ......... 257/109, 377, 381, 401; 438/218, 300
See application file for complete search history.

(56) References Cited

U.S. PATENT DOCUMENTS

| | | | |
|---|---|---|---|
| 6,878,606 B2 | 4/2005 | Ohnishi et al. | |
| 7,402,872 B2 | 7/2008 | Murthy et al. | |
| 7,413,961 B2 | 8/2008 | Chong et al. | |
| 7,719,062 B2 | 5/2010 | Fischer et al. | |
| 7,754,571 B2 | 7/2010 | Liao et al. | |
| 8,110,877 B2 | 2/2012 | Mukherjee et al. | |
| 8,823,065 B2 | 9/2014 | Wang et al. | |
| 8,846,461 B2 | 9/2014 | Lin et al. | |
| 8,853,035 B2 | 10/2014 | Yu et al. | |
| 8,853,673 B2 | 10/2014 | Shimamune | |
| 8,877,581 B2 | 11/2014 | Jain et al. | |
| 8,896,055 B2 | 11/2014 | Yeh et al. | |
| 8,901,537 B2 | 12/2014 | Murthy et al. | |
| 9,076,762 B2 | 7/2015 | Tsai et al. | |
| 9,099,494 B2 | 8/2015 | Wang et al. | |
| 9,105,490 B2 * | 8/2015 | Wang | H01L 29/66636 |
| 9,128,123 B2 | 9/2015 | Liu et al. | |
| 2005/0032327 A1 | 2/2005 | Ohnishi et al. | |
| 2006/0128105 A1 | 6/2006 | Ouyang et al. | |
| 2006/0199305 A1 | 9/2006 | Chen et al. | |
| 2007/0093051 A1 | 4/2007 | Miyoshi | |
| 2008/0157224 A1 * | 7/2008 | Fischer | H01L 21/76843 257/401 |
| 2010/0009473 A1 | 1/2010 | Mizoguchi | |
| 2010/0155846 A1 | 6/2010 | Mukherjee et al. | |
| 2010/0197092 A1 | 8/2010 | Kim et al. | |
| 2010/0276810 A1 * | 11/2010 | Chang | H01L 21/743 257/773 |
| 2010/0300733 A1 | 12/2010 | Kim et al. | |
| 2010/0301009 A1 | 12/2010 | Yoo et al. | |
| 2011/0079829 A1 | 4/2011 | Lai et al. | |
| 2011/0084404 A1 | 4/2011 | Yoko et al. | |
| 2012/0049201 A1 | 3/2012 | Yamaguchi et al. | |
| 2012/0068273 A1 | 3/2012 | Fischer et al. | |
| 2013/0214363 A1 | 8/2013 | Nemouchi et al. | |
| 2013/0260518 A1 | 10/2013 | Buss | |
| 2014/0084340 A1 | 3/2014 | Wang et al. | |
| 2014/0363943 A1 | 12/2014 | Wang et al. | |
| 2015/0311315 A1 | 10/2015 | Tsai et al. | |

FOREIGN PATENT DOCUMENTS

| | | |
|---|---|---|
| KR | 20110036505 | 4/2011 |
| KR | 20110084166 | 7/2011 |

OTHER PUBLICATIONS

Korean Office Action and English Translation, Apr. 18, 2013, 8 apges.

Nishimura, T., "Evidence for strong Fermi-level pinning due to metal-induced gap states at metal/germanium interface," IEEE, Applied Physics Letters, vol. 91, Issue 12, Sep. 2007, pp. 123123-123123-3.

* cited by examiner

FINFET LOW RESISTIVITY CONTACT FORMATION METHOD

PRIORITY CLAIM AND CROSS-REFERENCE

This application is continuation application of U.S. patent application Ser. No. 14/752,402, filed Jun. 26, 2015, entitled "Contact Structure of Semiconductor Device," which is a divisional of U.S. patent application Ser. No. 13/629,109, now U.S. Pat. No. 9,105,490, filed Sep. 27, 2012, entitled "Contact Structure Of Semiconductor Device," and is a continuation application of U.S. patent application Ser. No. 15/058,344, filed Mar. 2, 2016, entitled "FinFET Low Resistivity Contact Formation Method," which is a divisional application of U.S. patent application Ser. No. 14/491,848, filed Sep. 19, 2014, now U.S. Pat. No. 9,287,138 entitled "FinFET Low Resistivity Contact Formation Method," which is a continuation-in-part of, and claims the benefit of and priority to, U.S. patent application Ser. No. 13/629,109, filed on Sep. 27, 2012, now U.S. Pat. No. 9,105,490, titled "Contact Structure Of Semiconductor Device," which is hereby incorporated herein by reference.

This application relates to the following co-pending and commonly assigned patent application Ser. No. 13/672,258, filed Nov. 8, 2012, entitled "Contact Structure of Semiconductor Device," which applications are hereby incorporated herein by reference.

TECHNICAL FIELD

This disclosure relates to integrated circuit fabrication, and more particularly to a FinFET semiconductor device with a low resistivity contact.

BACKGROUND

As the semiconductor industry has progressed into nanometer technology process nodes in pursuit of higher device density, higher performance, and lower costs, challenges from both fabrication and design issues have resulted in the development of three-dimensional designs of a semiconductor device, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over three sides (e.g., wrapping) the fin. Having a gate on both sides of the channel allows gate control of the channel from both sides. Further advantages of FinFET comprise reducing the short channel effect and higher current flow.

However, there are challenges to implementation of such features and processes in complementary metal-oxide-semiconductor (CMOS) fabrication. For example, silicide formation on strained materials causes high contact resistance of source/drain regions of the FinFET, thereby degrading the device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
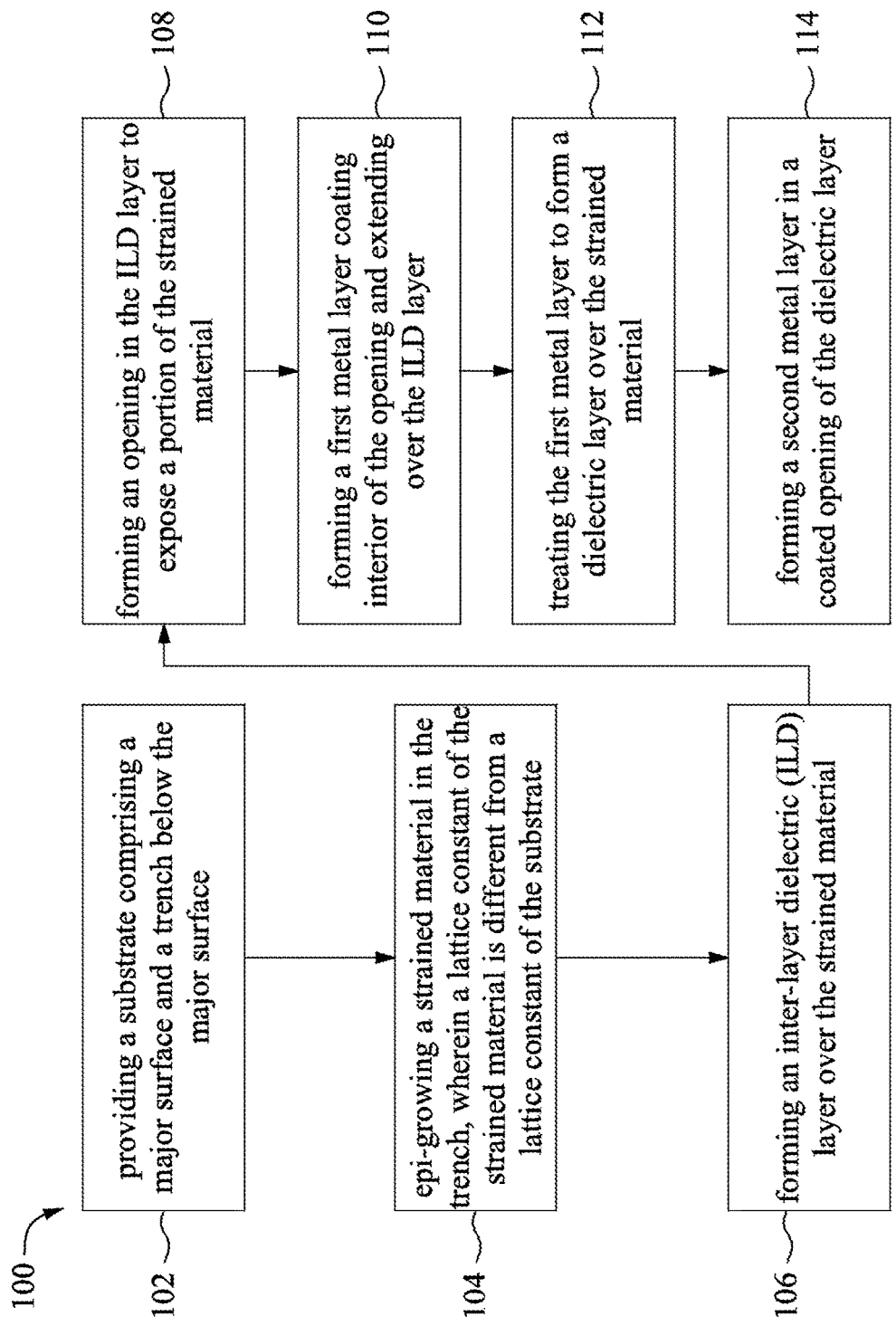
FIG. 1 is a flowchart illustrating a method of fabricating a contact structure of a semiconductor device according to various aspects of the present disclosure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a contact structure of a semiconductor device according to various aspects of the present disclosure. The method 100 begins with step 102 in which a substrate comprising a major surface and a trench below the major surface is provided. The method 100 continues with step 104 in which a strained material is epi-grown in the trench, wherein a lattice constant of the strained material is different from a lattice constant of the substrate. The method 100 continues with step 106 in which an inter-layer dielectric (ILD) layer is formed over the strained material. The method 100 continues with step 108 in which an opening is formed in the ILD layer to expose a portion of the strained material. The method 100 continues with step 110 in which a first metal layer is formed to coat interior of the opening and extend over the ILD layer. The method 100 continues with step 112 in which the first metal layer is treated to form a dielectric layer over the strained material. The method 100 continues with step 114 in which a second metal layer is formed in a coated opening of the dielectric layer. The discussion that follows illustrates embodiments of semiconductor devices that can be fabricated according to the method 100 of FIG. 1.

FIGS. 2-12 are schematic cross-sectional views of a semiconductor device 200 comprising a contact structure 230 at various stages of fabrication according to various aspects of the present disclosure. In some embodiments, the semiconductor device 200 may be a fin field effect transistor (FinFET), e.g., any fin-based, multi-gate transistor. In other embodiments, the semiconductor device 200 may be a planar metal-oxide-semiconductor field effect transistor (MOSFET). Other transistor structures and analogous structures are within the contemplated scope of this disclosure. The semiconductor device 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 12 are simplified for a better understanding of the concepts of the present disclosure. For example, although the figures illustrate the semiconductor device 200, it is understood the IC may comprise a number of other devices comprising resistors, capacitors, inductors, fuses, etc.

Figure 2:
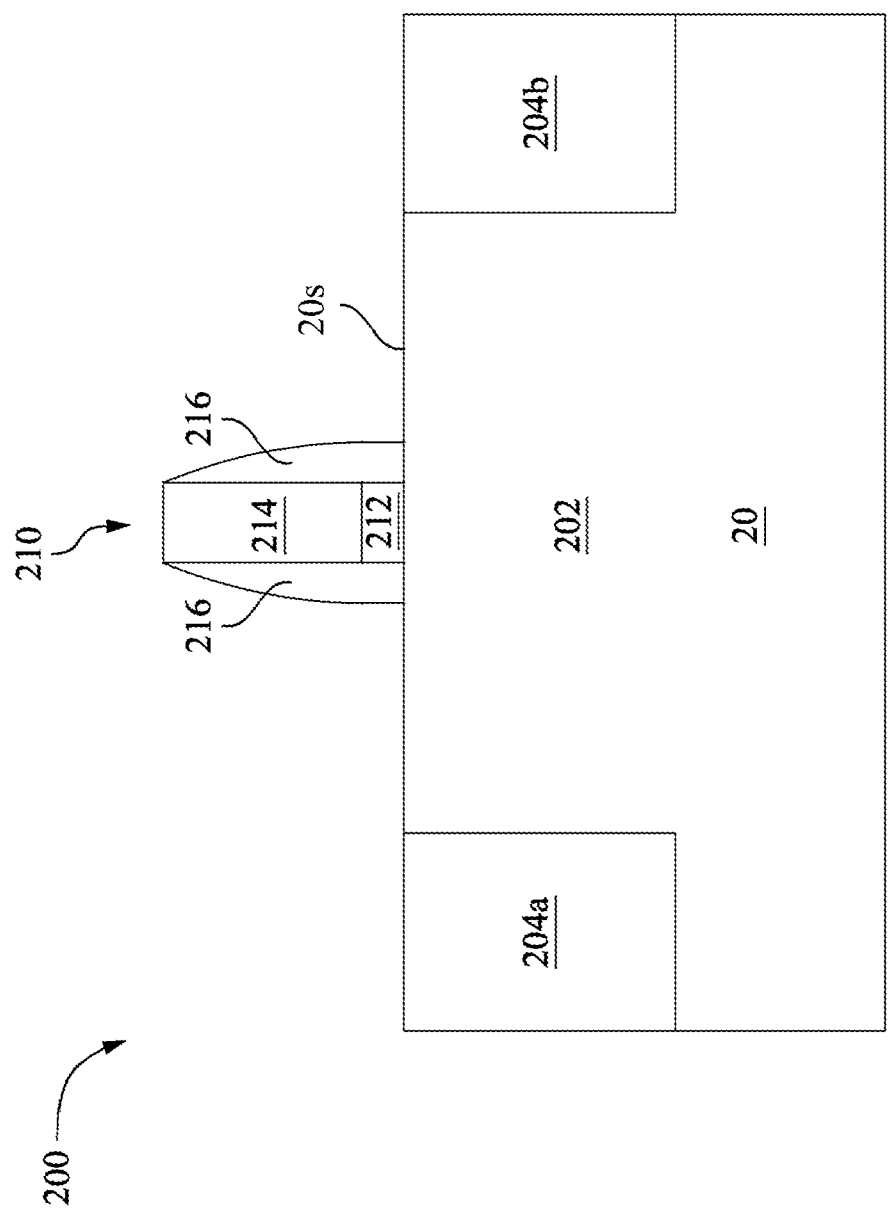
FIGS. 2-12 are schematic cross-sectional views of a semiconductor device comprising a contact structure at various stages of fabrication according to various aspects of the present disclosure, in accordance with some embodiments.

Referring to FIG. 2 and step 102 in FIG. 1, a substrate 20 comprising a major surface 20s is provided. In at least one embodiment, the substrate 20 comprises a crystalline silicon substrate (e.g., wafer). The substrate 20 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET or planar MOSFET, or alternatively configured for a p-type FinFET or planar MOSFET.

The substrate 20 may alternatively be made of some other suitable elementary semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 20 may include an epitaxial layer (epi-layer), may be strained for performance enhancement, and/or may include a silicon-on-insulator (SOI) structure.

In the depicted embodiment, the substrate 20 further comprises a fin structure 202. The fin structure 202, formed on the substrate 20, comprises one or more fins. In the present embodiment, for simplicity, the fin structure 202 comprises a single fin. The fin comprises any suitable material, for example, the fin may comprise silicon, germanium or compound semiconductor. The fin structure 202 may further comprise a capping layer (not shown) disposed on the fin, which may be a silicon-capping layer.

The fin structure 202 is formed using any suitable process comprising various deposition, photolithography, and/or etching processes. An exemplary photolithography process may include forming a photoresist layer (resist) overlying the substrate 20 (e.g., on a silicon layer), exposing the resist to a pattern, performing a post-exposure bake process, and developing the resist to form a masking element including the resist. The silicon layer may then be etched using reactive ion etching (RIE) processes and/or other suitable processes. In one example, silicon fins of the fin structure 202 may be formed using patterning and etching a portion of the substrate 20. In another example, silicon fins of the fin structure 202 may be formed using patterning and etching a silicon layer deposited overlying an insulator layer (for example, an upper silicon layer of a silicon-insulator-silicon stack of an SOI substrate). In still other embodiments, the fin structure is formed by forming a dielectric layer above a substrate, opening trenches in the dielectric layer, and epitaxially growing fins from the substrate in the trenches to form the fins.

In the depicted embodiment, isolation regions are formed within the substrate 20 to define and electrically isolate the various fins of the fin structure 202. In one example, the isolation regions include shallow trench isolation (STI) regions 204 (comprising 204a and 204b). The isolation regions may comprise silicon oxide, silicon nitride, silicon oxynitride, fluoride-doped silicate glass (FSG), a low-K dielectric material, and/or combinations thereof. The isolation regions, and in the present embodiment, the STI regions 204, may be formed by any suitable process. As one example, the formation of the STI regions 204 may include filling trenches between the fins (for example, using a chemical vapor deposition process) with a dielectric material. In some embodiments, the filled trench may have a multi-layer structure such as a thermal oxide liner layer filled with silicon nitride or silicon oxide.

Still referring to FIG. 2, a gate stack 210 is formed on the major surface 20s of the substrate 20 (i.e., a top surface of the fin structure 202) in between the STI regions 204. Although in the plane illustrated in the Figures, gate stack 210 extends only on the top surface of the fin, those skilled in the art will recognize that in another plane of the device (not shown in the drawings) the gate stack 210 extends along the sidewalls of fin structure 202. In some embodiments, the gate stack 210 comprises a gate dielectric layer 212 and a gate electrode layer 214 over the gate dielectric layer 212. In some embodiments, a pair of sidewall spacers 216 is formed on two sides of the gate stack 210. In the depicted embodiment, the gate stack 210 may be formed using any suitable process, including the processes described herein.

In one example, the gate dielectric layer 212 and gate electrode layer 214 are sequentially deposited over the substrate 20. In some embodiments, the gate dielectric layer 212 may include silicon oxide, silicon nitride, silicon oxynitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 212 is a high-k dielectric layer with a thickness in the range of about 10 angstroms to about 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the fin structure 202. The interfacial layer may comprise silicon oxide.

In some embodiments, the gate electrode layer 214 may comprise a single-layer or multilayer structure. In at least one embodiment, the gate electrode layer 214 comprises poly-silicon. Further, the gate electrode layer 214 may be doped poly-silicon with the uniform or non-uniform doping. In an alternative embodiment, the gate electrode layer 214 comprises a metal selected from a group of W, Cu, Ti, Ag, Al, TiAl, TiAlN, TaC, TaCN, TaSiN, Mn, and Zr. In an alternative embodiment, the gate electrode layer 214 comprises a metal selected from a group of TiN, WN, TaN, and Ru. In the present embodiment, the gate electrode layer 214 comprises a thickness in the range of about 30 nm to about 60 nm. The gate electrode layer 214 may be formed using a suitable process such as ALD, CVD, PVD, plating, or combinations thereof.

Then, a layer of photoresist (not shown) is formed over the gate electrode layer 214 by a suitable process, such as spin-on coating, and patterned to form a patterned photoresist feature by a proper lithography patterning method. In at least one embodiment, a width of the patterned photoresist feature is in the range of about 5 nm to about 45 nm. The patterned photoresist feature can then be transferred using a dry etching process to the underlying layers (i.e., the gate electrode layer 214 and the gate dielectric layer 212) to form the gate stack 210. The photoresist layer may be stripped thereafter.

Still referring to FIG. 2, the semiconductor device 200 further comprises a dielectric layer formed over the gate stack 210 and the substrate 20 and covering sidewalls of the gate stack 210. The dielectric layer may include silicon oxide, silicon nitride, or silicon oxy-nitride. The dielectric layer may comprise a single layer or multilayer structure. The dielectric layer may be formed by CVD, PVD, ALD, or other suitable technique. The dielectric layer comprises a thickness ranging from about 5 nm to about 15 nm. Then, an anisotropic etching is performed on the dielectric layer to form a pair of sidewall spacers 216 on two sides of the gate stack 210.

Figure 3:
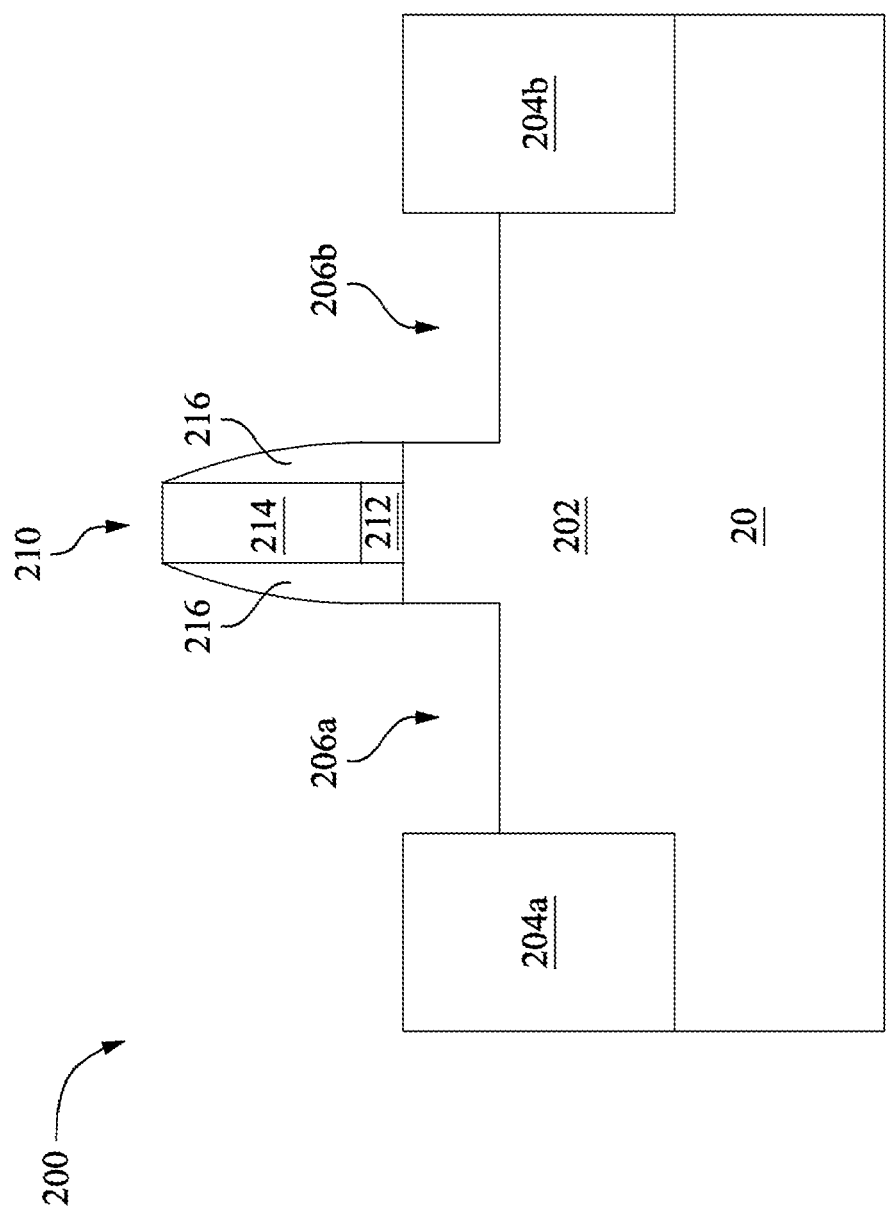

Referring to FIG. 3 and step 102 in FIG. 1, portions of the fin structure 202 (other than where the gate stack 210 and the pair of sidewall spacers 216 are formed thereover) are recessed to form source and drain (S/D) trenches 206 (comprising 206a and 206b) below the major surface 20s of the substrate 20 adjacent to the gate stack 210. In the depicted embodiment, each of the S/D trenches 206 is between the gate stack 210 and one of the STI regions 204. As such, the S/D trench 206a is adjacent to the gate stack 210, while the STI region 204a is disposed on a side of the S/D trench 206a opposite the gate stack 210. As such, the S/D trench 206b is adjacent to the gate stack 210, while the STI region 204b is disposed on a side of the S/D trench 206b opposite the gate stack 210.

In the depicted embodiment, using the gate stack 210 and the pair of sidewall spacers 216 as hard masks, a biased etching process is performed to recess the major surface 20s of the substrate 20 that are unprotected or exposed to form the S/D trenches 206. In one embodiment, the etching process may be performed under a pressure of about 1 mTorr to about 1000 mTorr, a power of about 50 W to about 1000 W, a bias voltage of about 20 V to about 500 V, at a temperature of about 40° C. to about 60° C., using a HBr and/or $Cl_2$ as etch gases. Also, in the embodiments provided, the bias voltage used in the etching process may be tuned to allow better control of an etching direction to achieve desired profiles for the S/D trenches 206.

Figure 4:
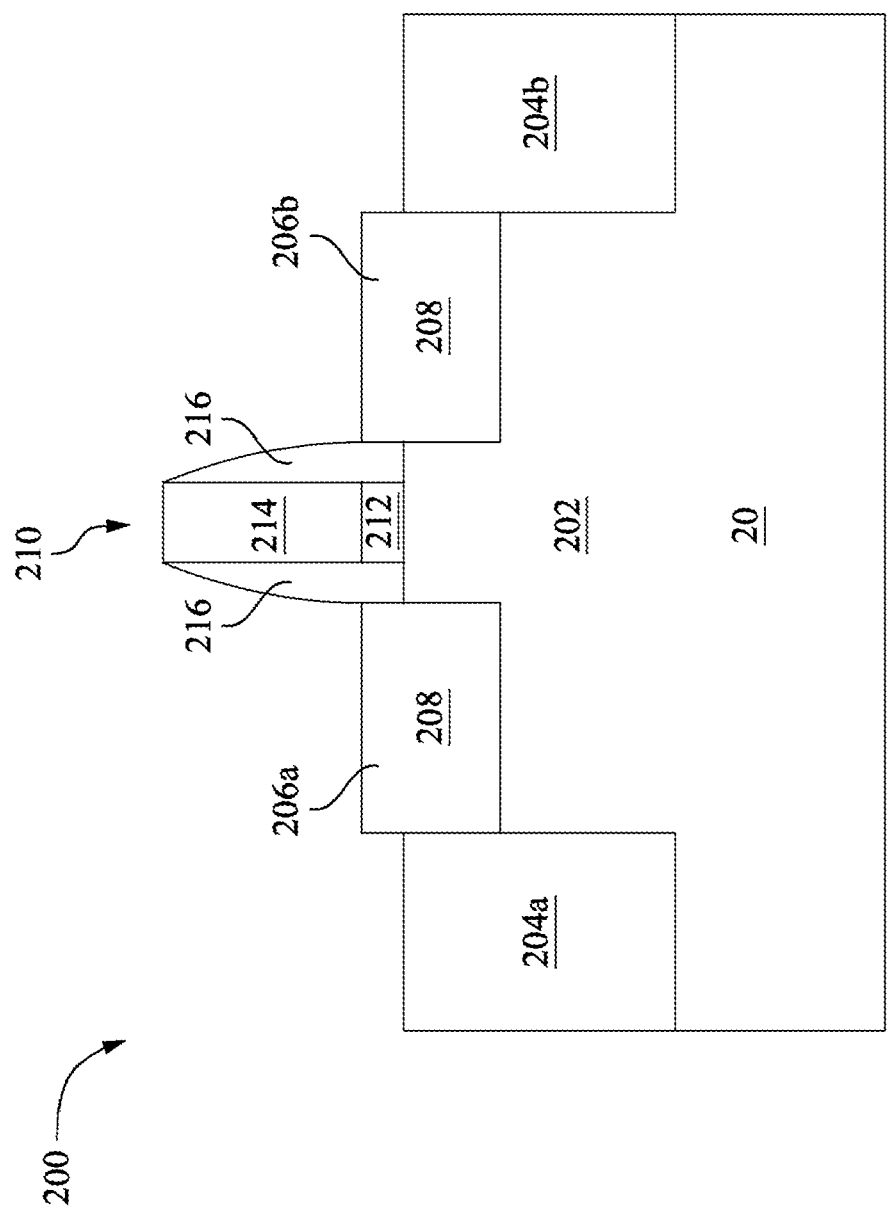

As depicted in FIG. 4 and step 104 in FIG. 1, after the formation of the S/D trenches 206 below the major surface 20s of the substrate 20, the structure in FIG. 4 is produced by epi-growing a strained material 208 in the S/D trenches 206, wherein a lattice constant of the strained material 208 is different from a lattice constant of the substrate 20. Thus, the channel region of the semiconductor device 200 is strained or stressed to enhance carrier mobility of the device.

In some embodiments, the strained material 208 comprises Si, Ge, SiGe, SiC, SiP, or III-V semiconductor material. In the depicted embodiment, a pre-cleaning process may be performed to clean the S/D trenches 206 with HF or other suitable solution. Then, the strained material 208 such as silicon germanium (SiGe) is selectively grown by a low-pressure CVD (LPCVD) process to fill the S/D trenches 206. In one embodiment, an upper surface of the strained material 208 is lower than the major surface 20s (not shown). In another embodiment, the strained material 208 filling the S/D trenches 206 extends upward over the major surface 20s. In the depicted embodiment, the LPCVD process is performed at a temperature of about 400 to about 800° C. and under a pressure of about 1 to about 15 Torr, using $SiH_2Cl_2$, HCl, $GeH_4$, $B_2H_6$, and $H_2$ as reaction gases.

The process steps up to this point have provided the substrate 20 having the strained material 208 in the S/D trenches 206. In some applications, silicide regions over the strained material 208 may be formed by blanket depositing a thin layer of metal material, such as nickel, titanium, cobalt, and combinations thereof. The substrate 20 is then heated, which causes silicon to react with the metal where contacted. After the reaction, a layer of metal silicide is formed between the silicon-containing material and the metal. The un-reacted metal is selectively removed through the use of an etchant that attacks the metal material but does not attack silicide. However, Fermi level pinning between the metal silicide and strained material 208 results in a fixed Schottky barrier height. This fixed Schottky barrier height causes high contact resistance of S/D regions of the semiconductor device and thus degrades the device performance.

Accordingly, the processing discussed below with reference to FIGS. 5-12 may form a contact structure comprising a conductive dielectric layer to replace the silicide regions. The conductive dielectric layer may serve as a low-resistance intermediate layer to replace high-resistance metal silicide. As such, the contact structure may provide low contact resistance of S/D regions of the semiconductor device, thereby enhancing the device performance.

Figure 5:
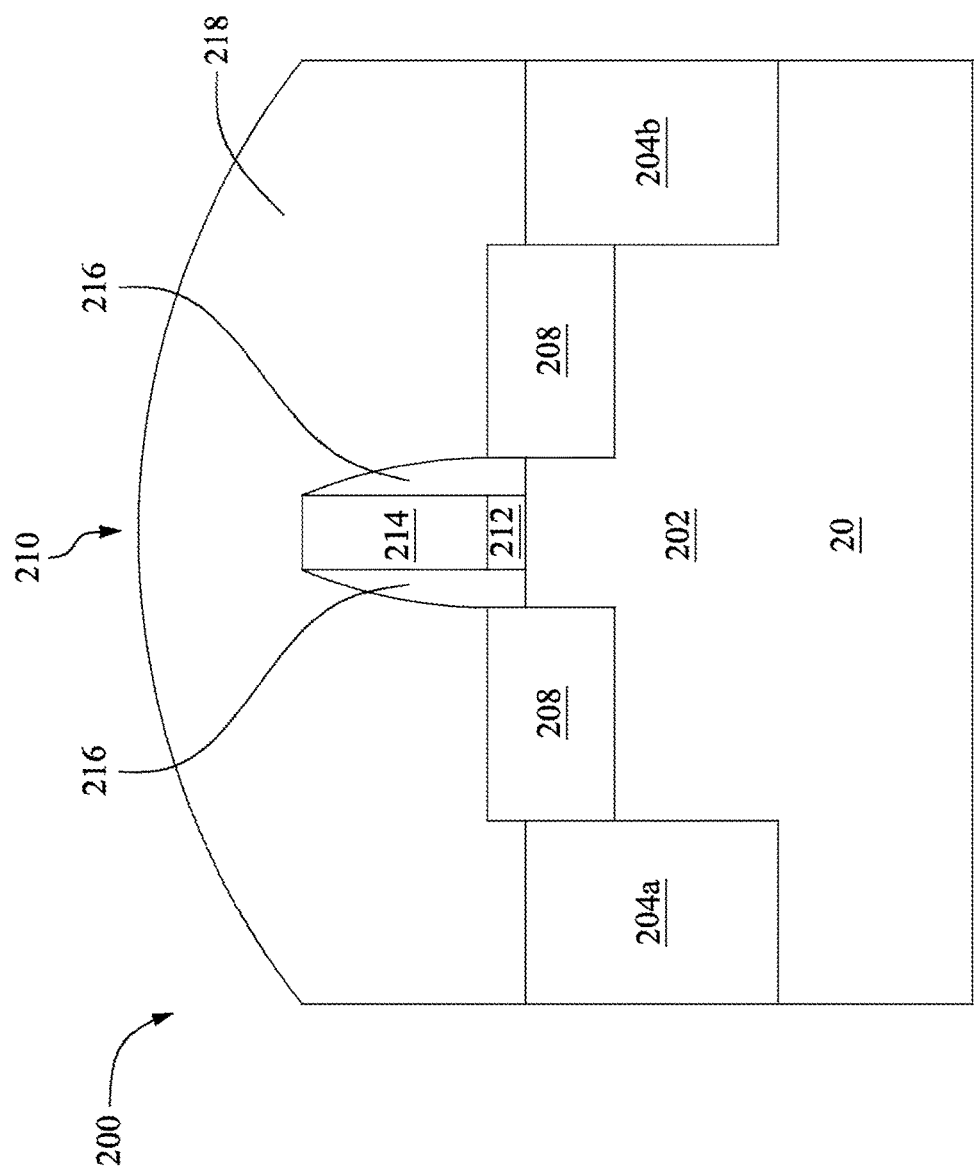
Figure 6:
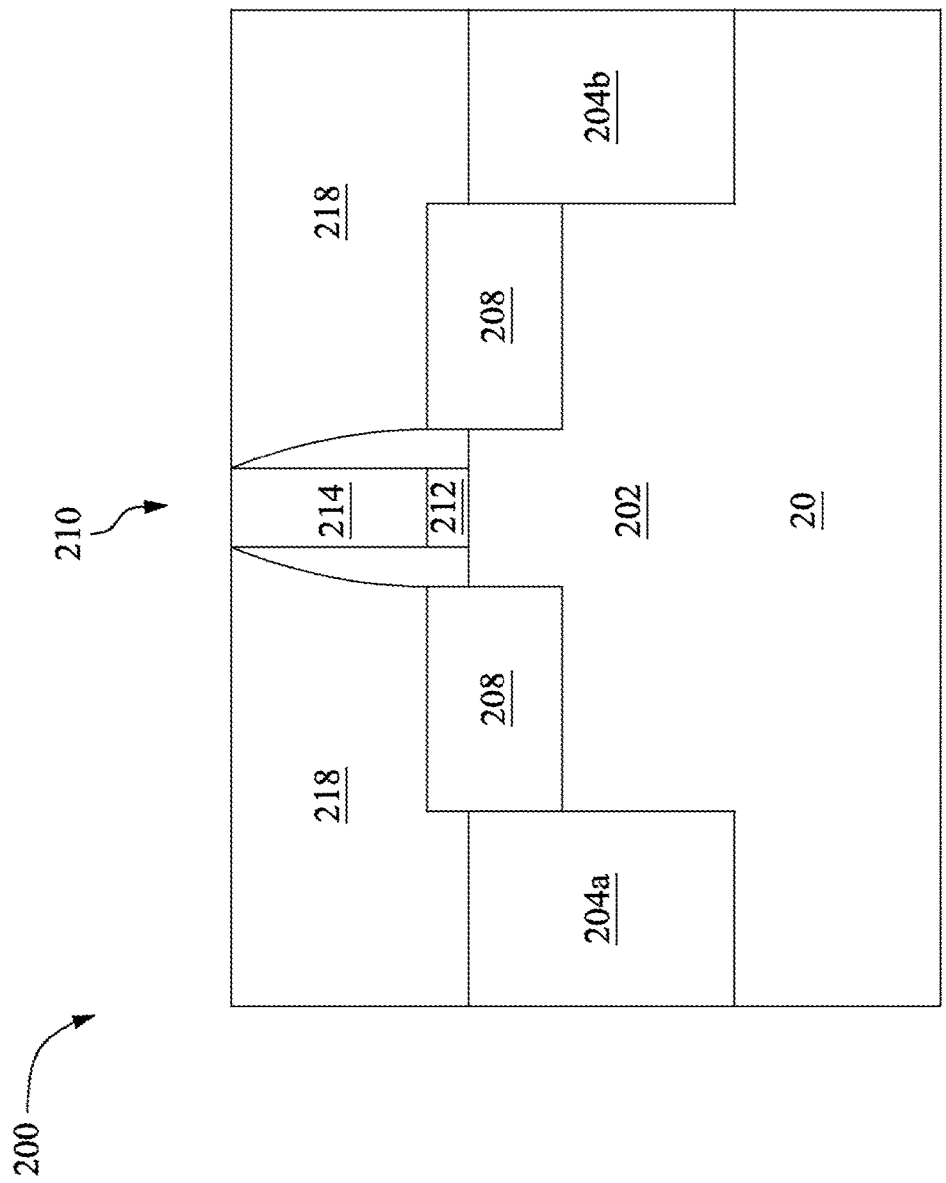

As depicted in FIGS. 5 and 6 and step 106 in FIG. 1, for fabricating a contact structure (such as a contact structure 230 shown in FIG. 12) of the semiconductor device 200, the structure in FIG. 5 is produced by forming an inter-layer dielectric (ILD) layer 218 over the strained material 208, the gate stack 210, the pair of sidewall spacers 216 and the STI regions 204.

The ILD layer 218 comprises a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), and/or combinations thereof. In some embodiments, the ILD layer 218 may be formed over the strained material 208 by CVD, high density plasma (HDP) CVD, sub-atmospheric CVD (SACVD), spin-on, sputtering, or other suitable methods. In the present embodiment, the ILD layer 218 has a thickness in the range of about 4000 Å to about 8000 Å. It is understood that the ILD layer 218 may comprise one or more dielectric materials and/or one or more dielectric layers.

Subsequently, the ILD layer 218 is planarized using a CMP process until a top surface of the gate electrode layer 214 is exposed or reached (shown in FIG. 6). The CMP process has a high selectivity to provide a substantially planar surface for the gate electrode layer 214 and ILD layer 218.

Subsequent CMOS processing steps applied to the semiconductor device 200 of FIG. 6 comprise forming contact opening through the ILD layer 218 to provide electrical contacts to S/D regions of the semiconductor device 200.

Figure 7:
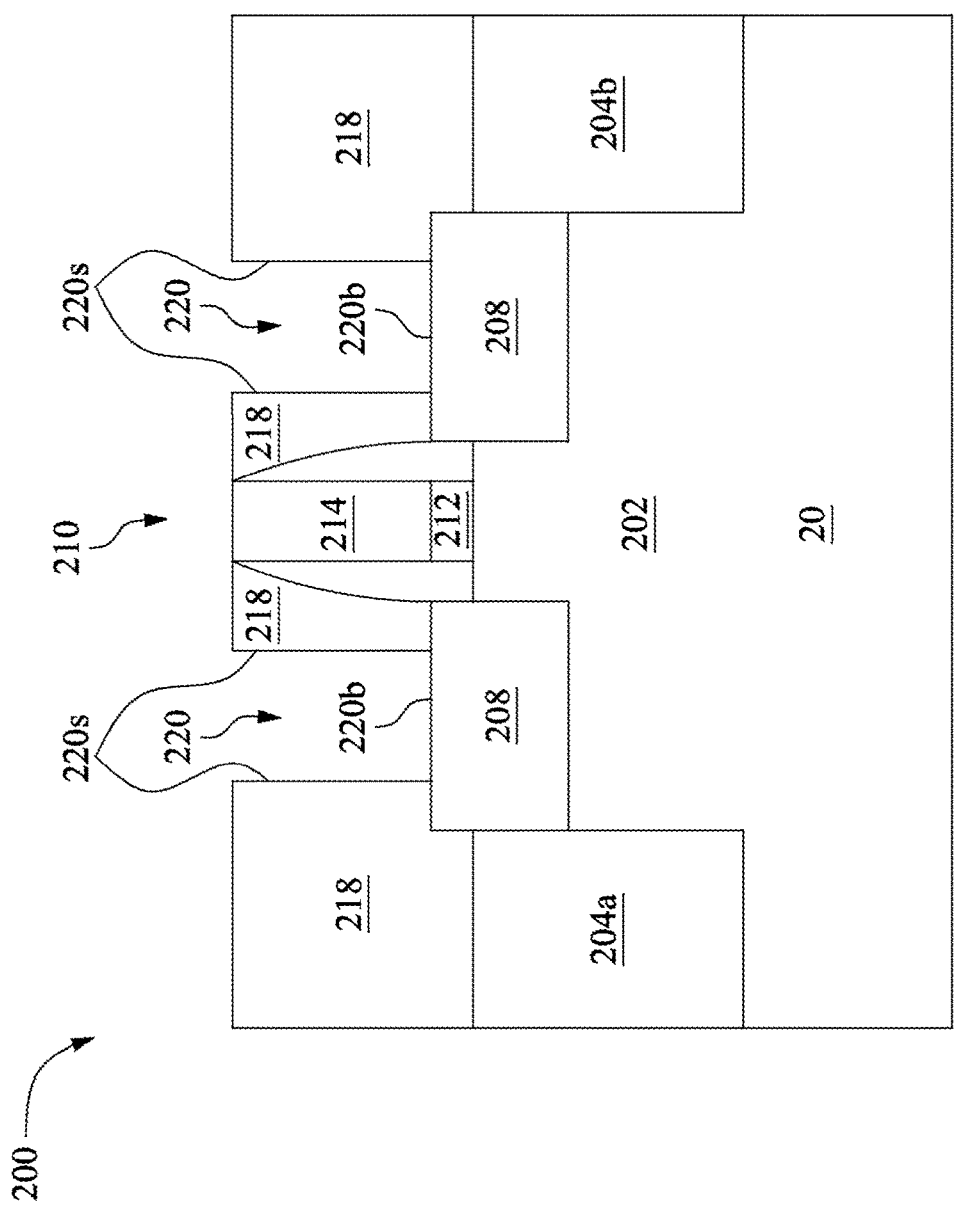

Referring to FIG. 7, the structure in FIG. 7 is produced by forming an opening 220 in the ILD layer 218 to expose a portion of the strained material 208 (step 108 in FIG. 1). As one example, the formation of the opening 220 includes forming a layer of photoresist (not shown) over the ILD layer 218 by a suitable process, such as spin-on coating, patterning the layer of photoresist to form a patterned photoresist feature by a proper lithography method, etching the exposed ILD layer 218 (for example, by using a dry etching, wet etching, and/or plasma etching process) to remove portions of the ILD layer 218 to expose a portion of the strained material 208. As such, the opening 220 is over the strained material 208, wherein the opening 220 comprises dielectric sidewalls 220s and a strained material bottom 220b. The patterned photoresist layer may be stripped thereafter.

Figure 8:
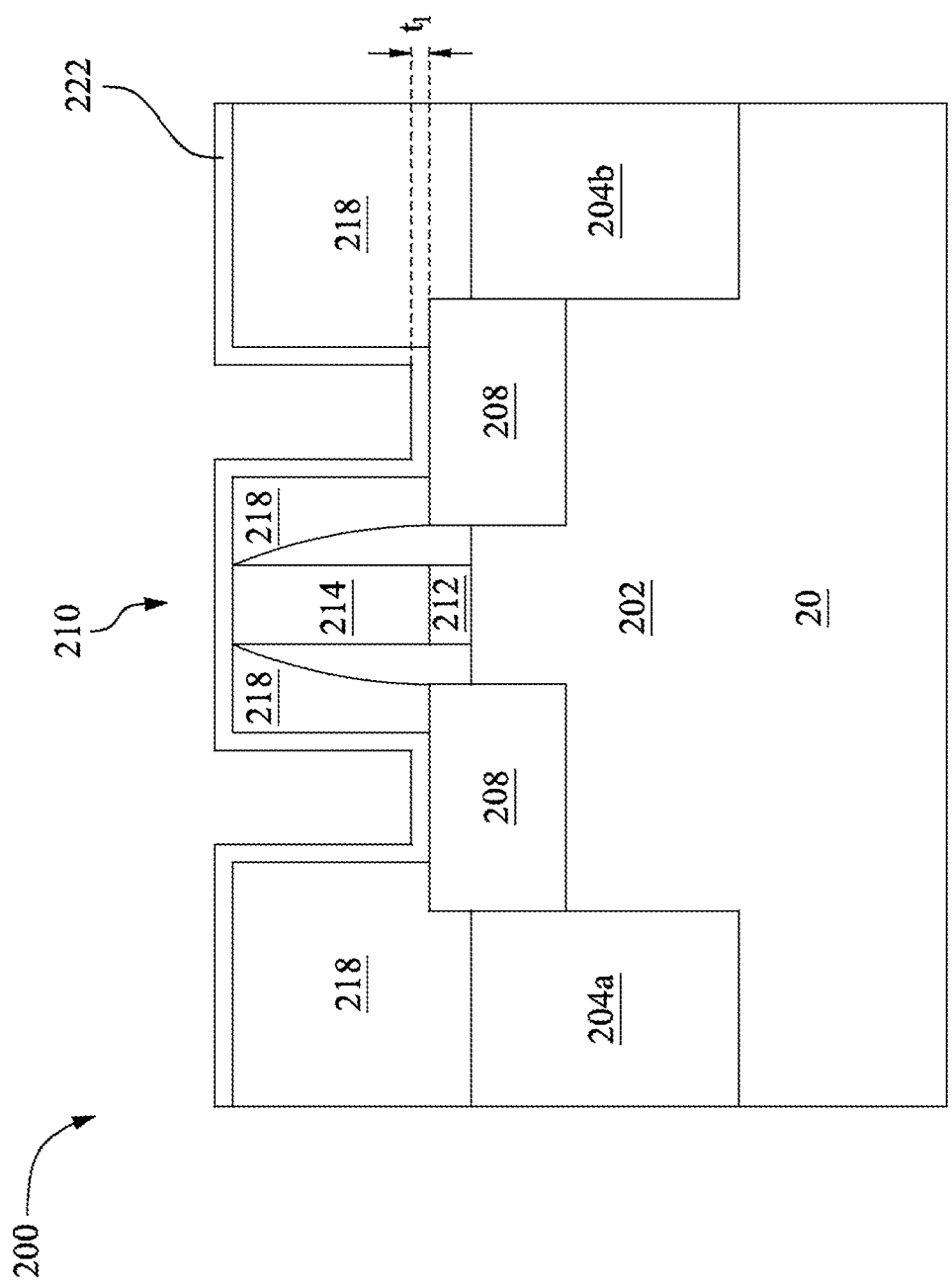

Referring to FIG. 8 and step 110 in FIG. 1, after formation of the opening 220 in the ILD layer 218, the structure in FIG. 8 is produced by forming a first metal layer 222 coating interior of the opening 220 and extending over the ILD layer 218 and the gate stack 210. In some embodiments, the first metal layer 222 may comprise Ti, Al, Zr, Hf, Ta, In, Ni, Be, Mg, Ca, Y, Ba, Sr, Sc, or Ga, and may be formed using a method such as CVD, ALD or sputtering. In some embodiments, the first metal layer 222 has a first thickness $t_1$ ranging from about 1 nm to about 4 nm.

Figure 9:
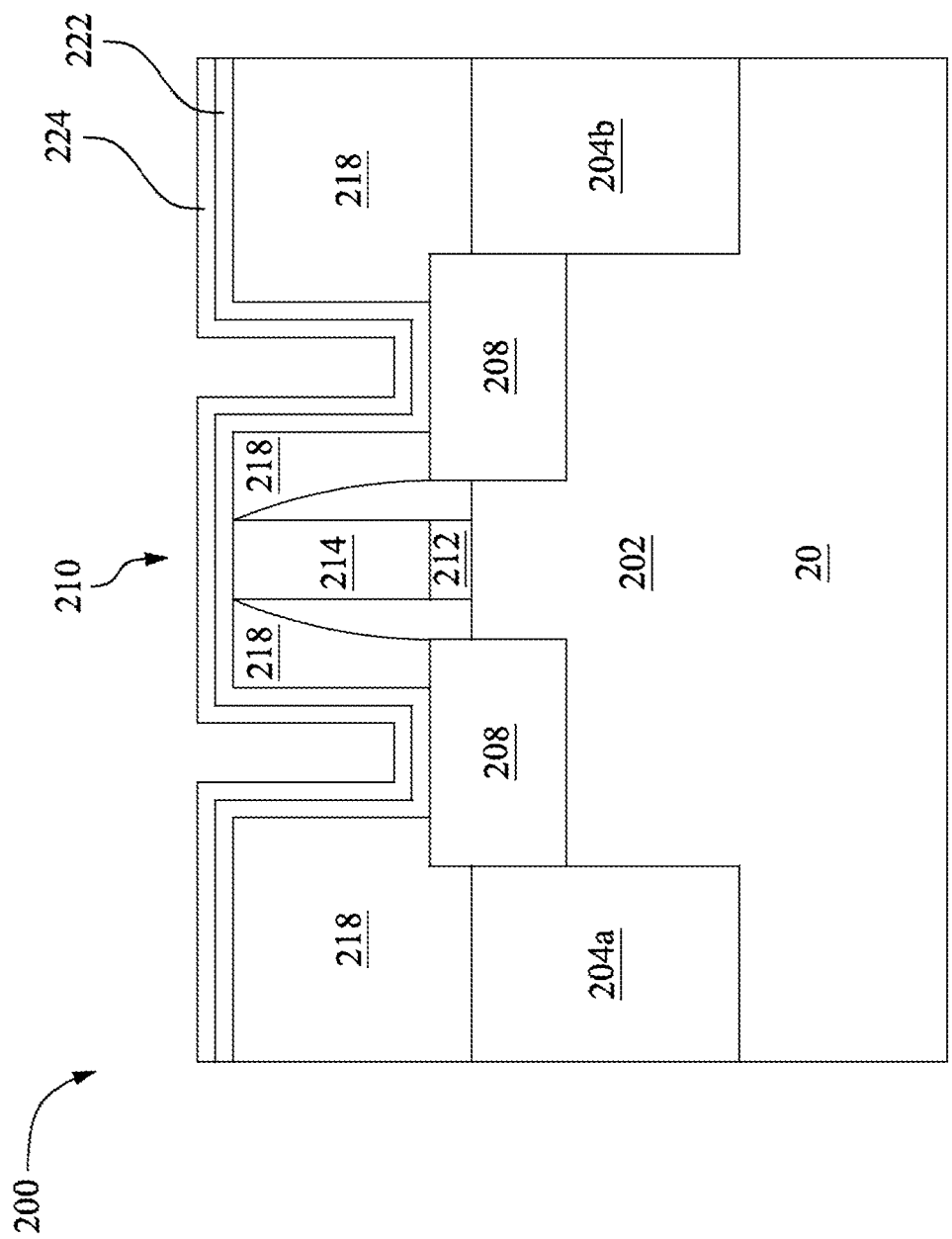
Figure 10:
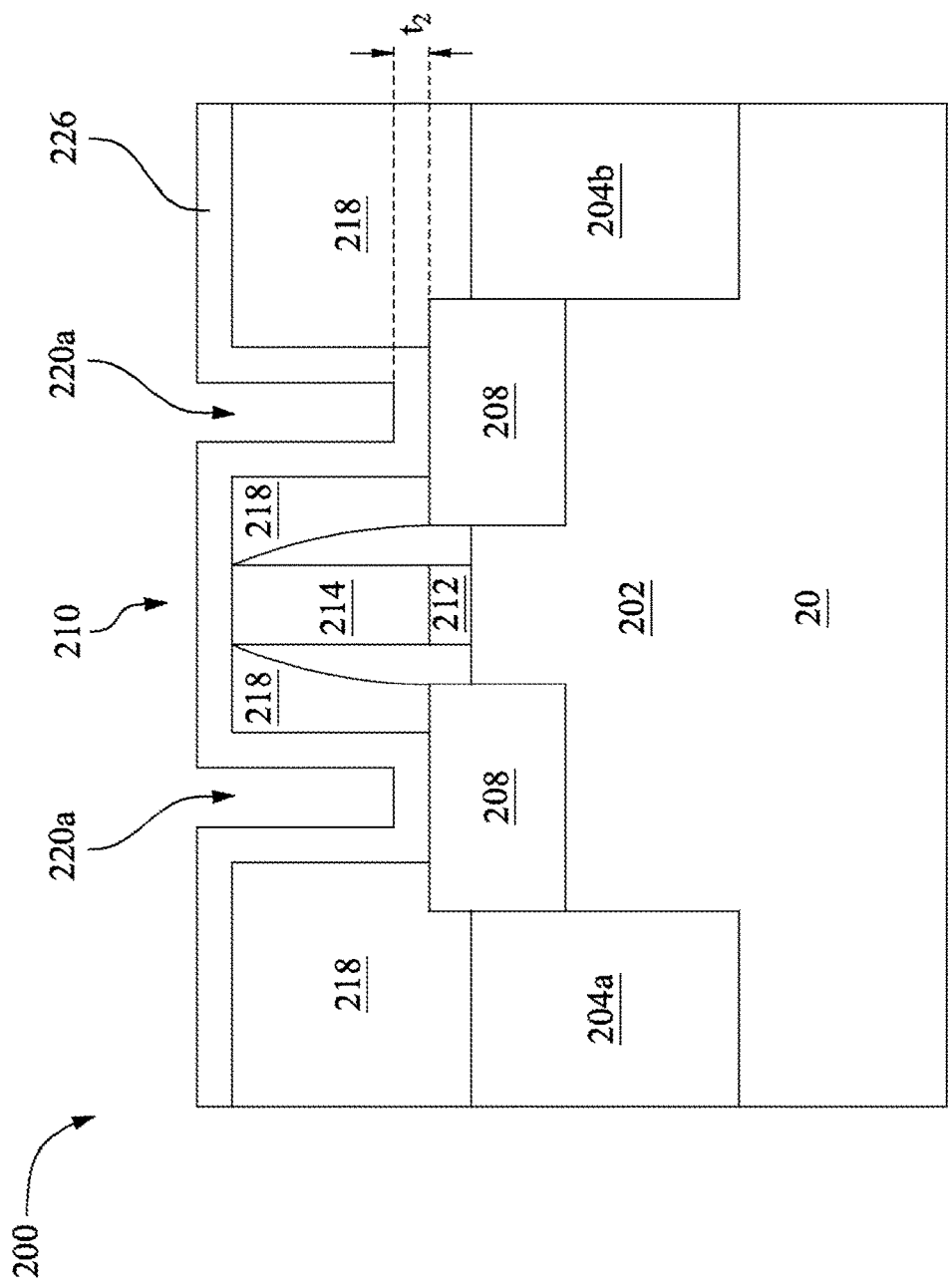

Referring to FIGS. 9 and 10 and step 112 in FIG. 1, subsequent to the formation of the first metal layer 222, the structures in FIG. 10 is produced by treating the first metal layer 222 to form a dielectric layer 226 over the strained material 208. In the depicted embodiments, the step of treating the first metal layer 222 is first performed by exposing a surface of the first metal layer 222 to an oxygen-containing environment, such as air or a sealed chamber, under an oxygen pressure of about $1*10^{-10}$ Torr to about 760 Torr, resulting in a blanket adsorbed oxygen-containing film 224 formed over a surface of the first metal layer 222 (shown in FIG. 9). In some embodiments, the oxygen-containing environment comprises $H_2O$, $O_2$, or $O_3$.

After exposing the surface of the first metal layer 222 to the oxygen-containing environment, the step of treating the first metal layer 222 further comprises exposing the surface of the first metal layer 222 to an inert gas, at a temperature of about 200° C. to about 800° C. In some embodiments, the inert gas comprises $N_2$, He, or Ar. In the depicted embodiment, the blanket adsorbed oxygen-containing film 224 react with the first metal layer 222 in contact therewith to form the dielectric layer 226 over the strained material 208. In some embodiments, the dielectric layer 226 coating interior of the opening 220 forms a coated opening 220a.

In some embodiments, the dielectric layer 226 has a second thickness $t_2$ ranging from about 1 nm to about 10 nm, making the dielectric layer 226 conductive. As such, the dielectric layer 226 is referred to as a conductive dielectric layer 226 hereafter. In at least one embodiment, the conductive dielectric layer 226 comprises TiO, $TiO_2$, or $Ti_2O_3$. In an alternative embodiment, the conductive dielectric layer 226 comprises $Al_2O_3$. In an alternative embodiment, the conductive dielectric layer is selected from an oxide of the group consisting of Zr, Hf, Ta, In, Ni, Be, Mg, Ca, Y, Ba, Sr, Sc, Ga, and mixtures thereof. In the depicted embodiment, the conductive dielectric layer 226 may reduce the fixed Schottky barrier height and serve as a low-resistance intermediate layer to replace high-resistance metal silicide, thereby enhancing the device performance.

Figure 11:
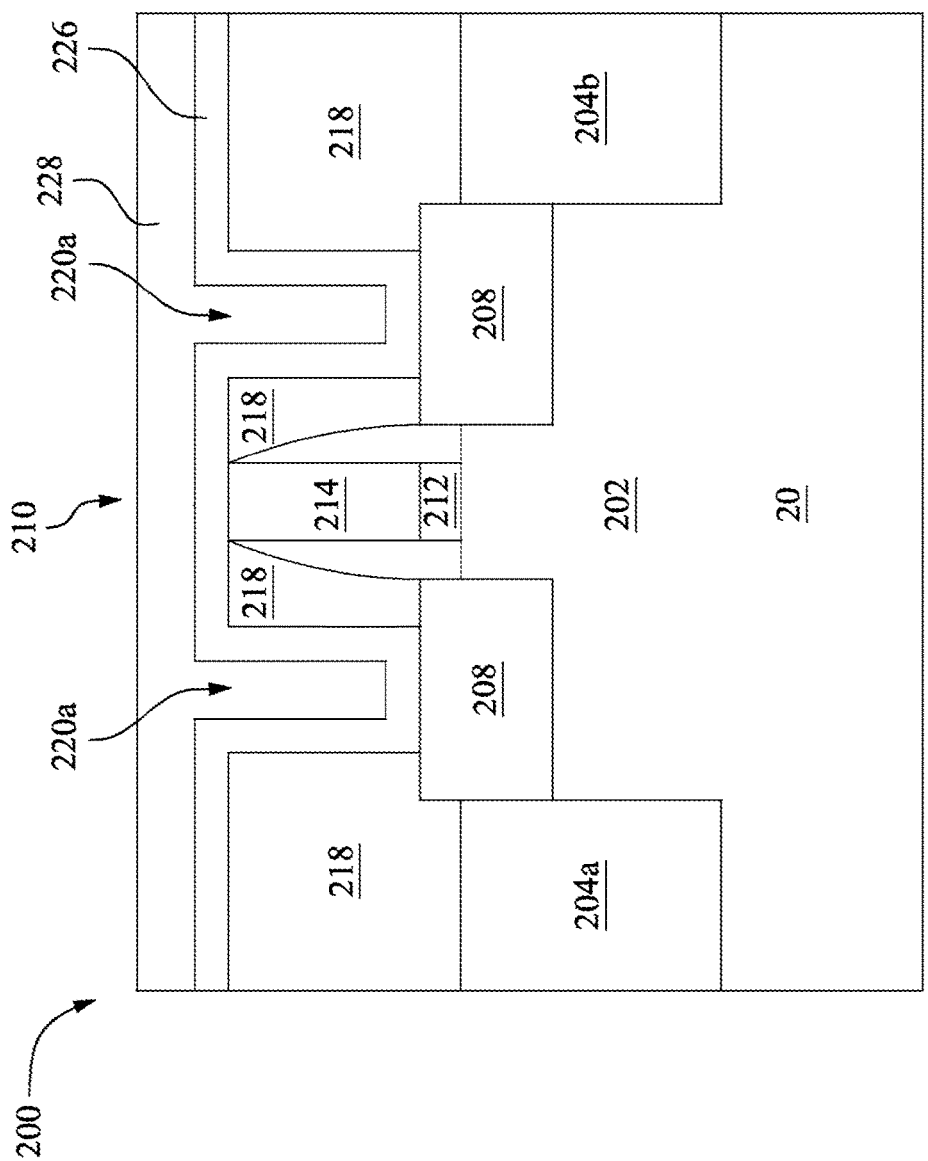
Figure 12:
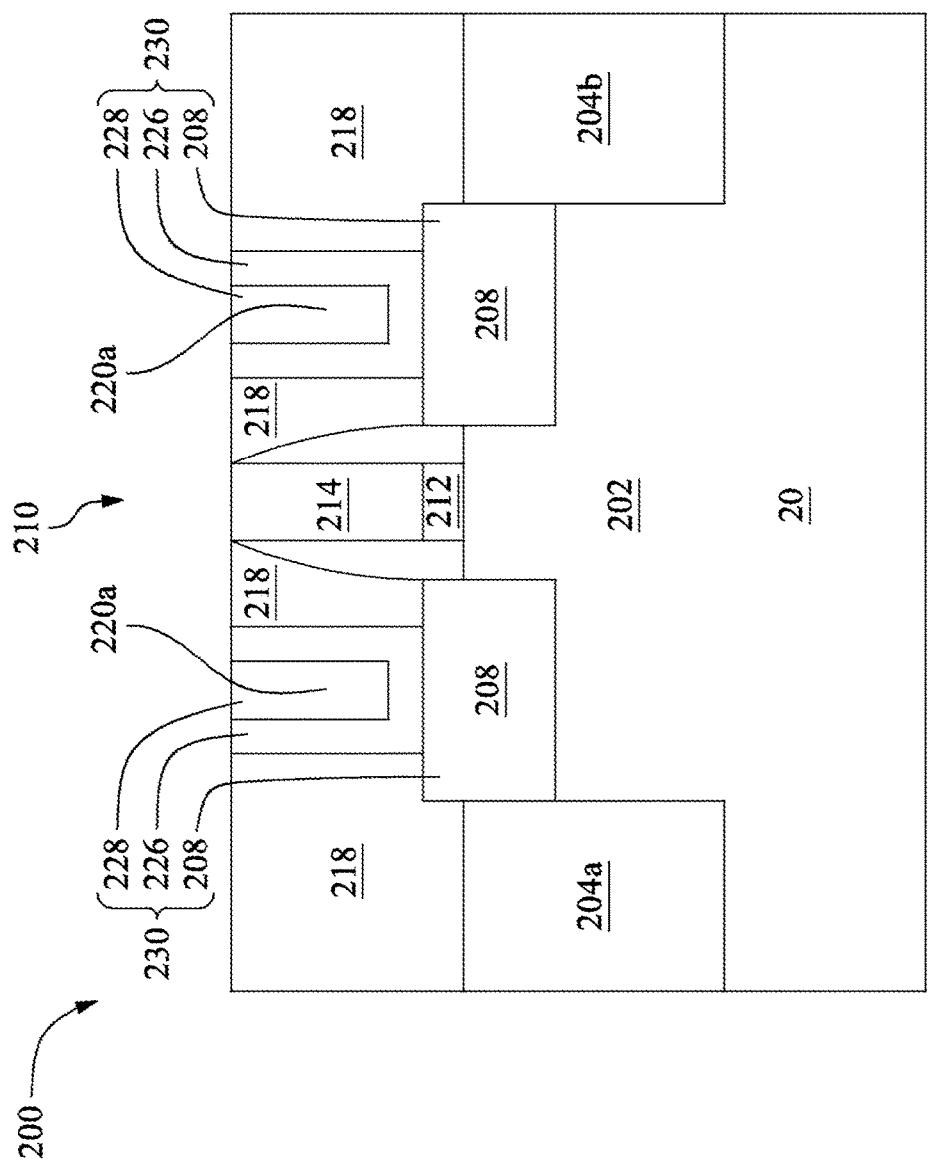

Referring to FIGS. 11 and 12 and step 114 in FIG. 1, following formation of the conductive dielectric layer 226, the structures in FIG. 11 is produced by forming a second metal layer 228 in the coated opening 220a of the conductive dielectric layer 226. In the depicted embodiment, the second metal layer 228 is deposited over the conductive dielectric layer 226 to fill the coated opening 220a of the conductive dielectric layer 226. In some embodiments, the second metal layer 228 comprises Ta, Ti, Hf, Zr, Ni, W, Co, Cu, or Al. In some embodiments, the second metal layer 228 may be formed by CVD, PVD, plating, ALD, or other suitable technique. In some embodiment, the second metal layer 228 may comprise a laminate. The laminate may further comprise a barrier metal layer, a liner metal layer or a wetting metal layer. Further, the thickness of the second metal layer 228 will depend on the depth of the coated opening 220a. The second metal layer 228 is thus deposited until the coated opening 220a are substantially filled or over-filled.

Then, another CMP is performed to planarize the second metal layer 228 after filling the coated opening 220a (shown in FIG. 12). Since the CMP removes a portion of the second metal layer 228 outside of the coated opening 220a, the CMP process may stop when reaching the ILD layer 218, and thus providing a substantially planar surface.

In some embodiments, with respect to the example depicted in FIGS. 2-12, the contact structure 230 for the semiconductor device 200 thus comprises the substrate 20 comprising the major surface 20s and the S/D trenches 206 below the major surface 20s (shown in FIG. 3); the strained material 208 filling the S/D trenches 206, wherein a lattice constant of the strained material 208 is different from a lattice constant of the substrate 20 (shown in FIG. 4); the inter-layer dielectric (ILD) layer 218 having the opening 220 over the strained material 208, wherein the opening 220 comprises dielectric sidewalls 220s and the strained material bottom 220b (shown in FIG. 7); a dielectric layer 226 coating the dielectric sidewalls 220s and material bottom 220b of the opening 220, wherein the dielectric layer 226 has the thickness $t_2$ ranging from 1 nm to 10 nm (shown in FIG. 10); and the second metal layer 228 filling the coated opening 220a of the dielectric layer 226 (shown in FIG. 12).

In the depicted embodiment, the gate stack 210 is fabricated using a gate-first process. In an alternative embodiment, the gate stack 210 may be fabricated using a gate-last process performed by first forming a dummy gate stack. In some embodiments, the gate-last process comprises forming an ILD layer surrounding the dummy gate stack, removing a dummy gate electrode layer to form a trench in the ILD layer, then filling the trench with a conductive gate electrode layer. In some embodiments, the gate-last process comprises forming an ILD layer surrounding the dummy gate stack, removing a dummy gate electrode layer and a dummy gate dielectric layer to form a trench in the ILD layer, then filling the trench with a gate dielectric layer and a conductive gate electrode layer.

After the steps shown in FIG. 1, as further illustrated with respect to the example depicted in FIGS. 2-12, have been performed, subsequent processes, comprising interconnect processing, are performed to complete the semiconductor device 200 fabrication. It has been observed that the contact structure 230 comprising a conductive dielectric layer 226 may provide a low-resistance path for interconnection, thus upgrading the device performance.

Figure 13:
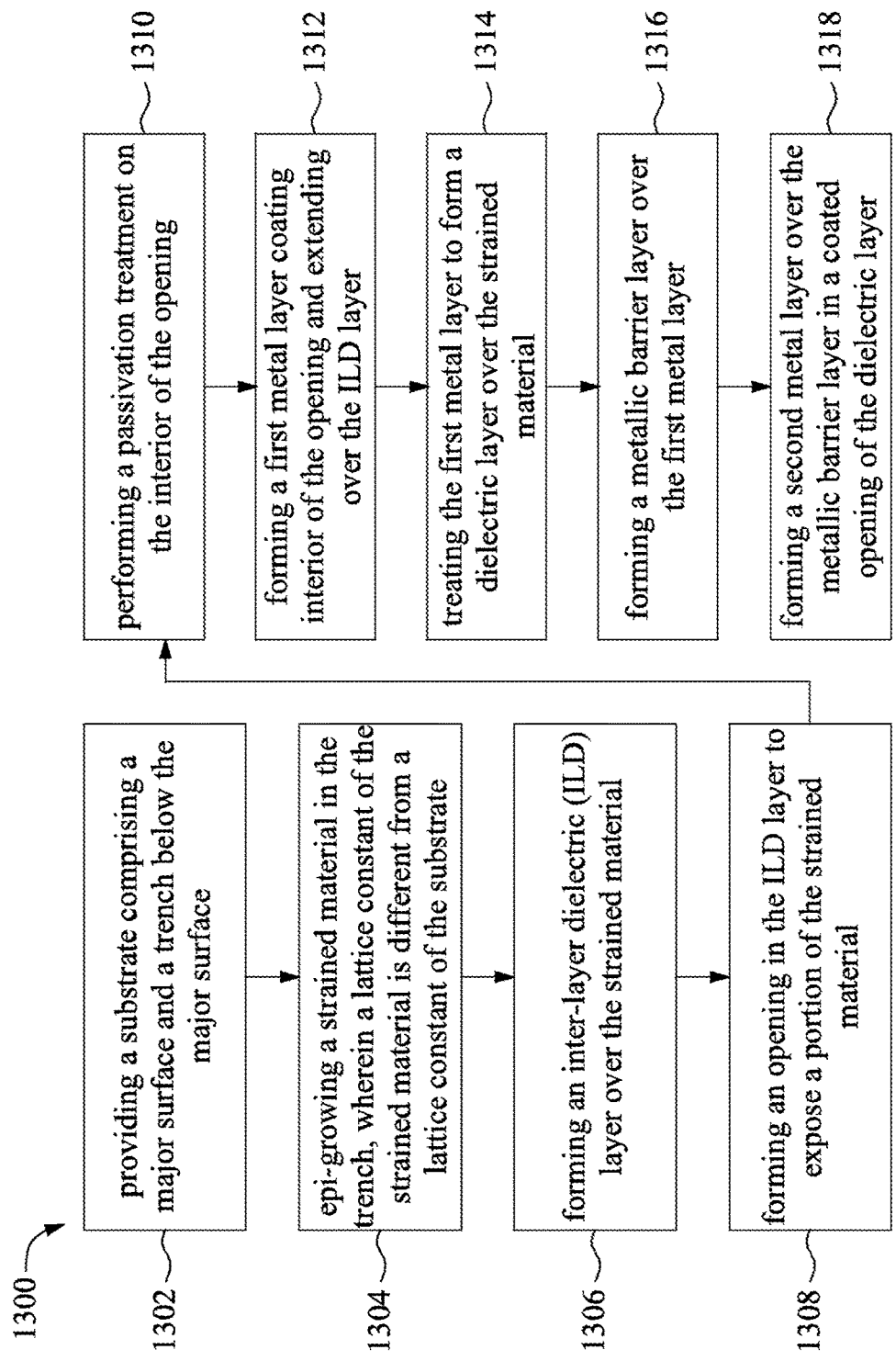
FIG. 13 is a flowchart illustrating a method of fabricating a contact of a semiconductor device according to various aspects of the present disclosure, in accordance with some embodiments.

Turning now to FIG. 13, illustrated is a flowchart of a second method 1300, which is an alternative method of fabricating a contact of a semiconductor device according to various aspects of the present disclosure. The second method 1300 begins with step 1302 in which a substrate comprising a major surface and a trench below the major surface is provided. The second method 1300 continues with step 1304 in which a strained material is epi-grown in the trench, wherein a lattice constant of the strained material is different from a lattice constant of the substrate. The second method 1300 continues with step 1306 in which an inter-layer dielectric (ILD) layer is formed over the strained material. The second method 1300 continues with step 1308 in which an opening is formed in the ILD layer to expose a portion of the strained material. The second method 1300 continues with step 1310 in which a passivation treatment is performed on the interior of the opening in the ILD layer. The second method 1300 continues with step 1312 in which a first metal coats an interior of the opening and extends over the ILD layer. The second method 1300 continues with step 1314 in which the first metal layer is treated to form a dielectric layer over the treated strained material. The second method 1300 continues with step 1316 in which a metallic barrier layer is formed over the dielectric layer. The second method 1300 continues with step 1318 in which a second metal layer is formed over the metallic barrier layer in a coated opening of the dielectric layer. The discussion that follows illustrates embodiments of semiconductor devices that can be fabricated according to the second method 1300 of FIG. 13.

The second method 1300 of fabricating a contact of a semiconductor device results in the contact receiving a passivation treatment before the metal and dielectric layers are formed. By performing the passivation treatment, the density of interface traps ($D_{it}$) on the strained material and ILD layer may be reduced. Reducing the $D_{it}$ may reduce Fermi level pinning, which avoids fixing of the Schottky barrier height and thereby further decreases the contact resistance of source and drain regions of the semiconductor device. This decreased contact resistance may increase the device performance. In some embodiments, an additional metal barrier is added between the first and second metal layers, preventing or reducing oxygen from gathering in and oxidizing the second metal layer during subsequent steps such as back-end processing, which may also decrease the contact resistance and increase device performance.

FIGS. 14A-20B are schematic cross-sectional views of a second semiconductor device 300 comprising a second contact structure 306 at various stages of fabrication according to various aspects of the present disclosure. In some embodiments, the second semiconductor device 300 may be a fin field effect transistor (FinFET), e.g., any fin-based, multi-gate transistor. In other embodiments, the second semiconductor device 300 may be a planar metal-oxide-semiconductor field effect transistor (MOSFET). Other transistor structures and analogous structures are within the contemplated scope of this disclosure. The second semiconductor device 300 may be included in a microprocessor, memory cell, and/or other integrated circuit (IC).

The "A" figures (e.g., FIG. 14A) illustrate a cross-sectional view along a longitudinal axis of a fin, and the "B" figures (e.g., FIG. 14B) illustrate a cross-sectional view along an axis orthogonal to a longitudinal axis of a fin in the source/drain regions. For reference, the "A" figures are along the A-A line of the respective "B" figures, and the "B" figures are along the B-B line of the respective "A" figures. The embodiments illustrated in the "B" figures show two FinFETs for illustrative purposes, but any number and types of semiconductor devices may be used in other embodiments.

It is noted that, in some embodiments, the performance of the operations mentioned in FIG. 13 does not produce a completed second semiconductor device 300. A completed second semiconductor device 300 may be fabricated many ways not discussed below, e.g., through complementary metal-oxide-semiconductor (CMOS) technology processing. Accordingly, it is understood that additional processes may be provided before, during, and/or after the second method 1300 of FIG. 13, and that some other processes may only be briefly described herein. Also, FIGS. 14A through 21 are simplified for a better understanding of the concepts of the present disclosure. For example, although the figures illustrate the second semiconductor device 300, it is understood the IC may comprise a number of other devices comprising resistors, capacitors, inductors, fuses, etc.

Figure 14A:
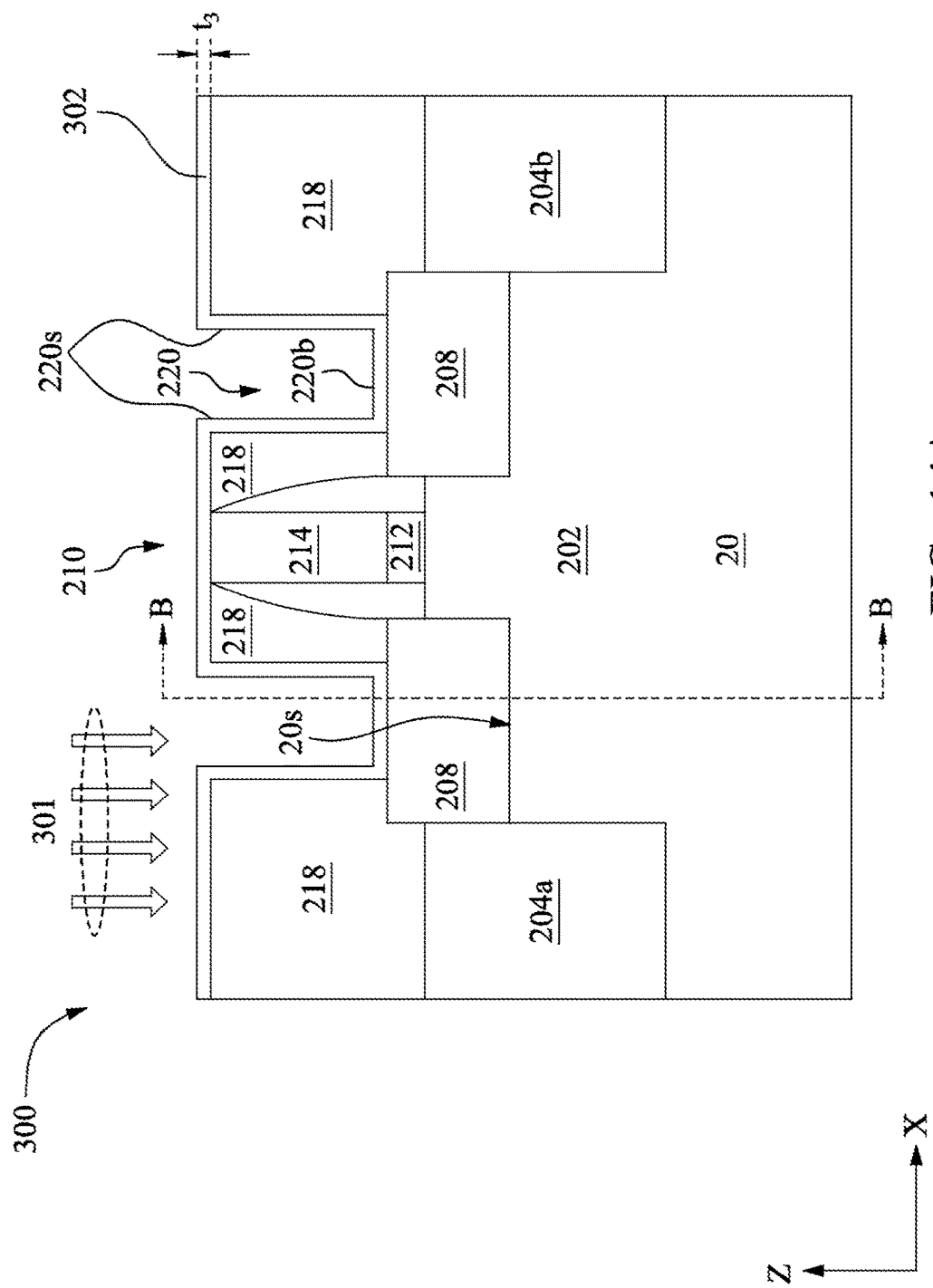
FIGS. 14A-20B are schematic cross-sectional views of a semiconductor device comprising a contact structure at various stages of fabrication according to various aspects of the present disclosure, in accordance with some embodiments
Figure 14B:
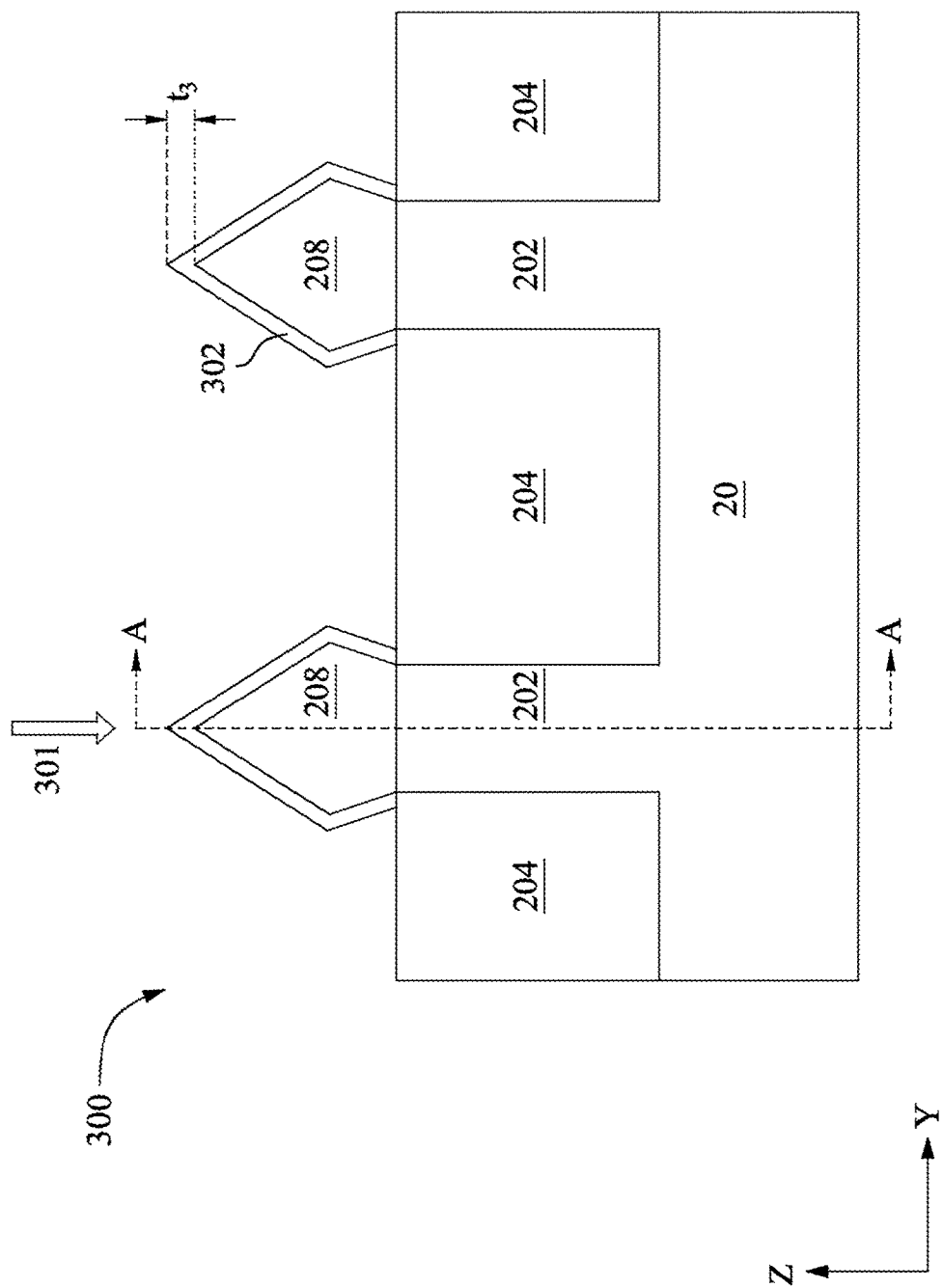

Referring first to FIGS. 14A-14B and step 1310 in FIG. 13, a second semiconductor device 300 is provided. In some embodiments, the second semiconductor device 300 provided in FIGS. 14A-14B is formed by performing a passivation treatment on the structure formed as discussed above with respect to FIGS. 2-7 and steps 102-108 in the method 100 of FIG. 1. Because the steps 1302-1308 of the second method 1300 may substantially correspond to the steps 102-108 of the method 100, they will not be repeated herein for the purpose of conciseness.

Accordingly, after providing the second semiconductor device 300 and forming an opening 220 in the ILD layer 218 to expose a portion of the strained material 208, the second semiconductor device 300 may be treated by a passivation treatment 301 (indicated by the arrows in FIGS. 14A-14B) to form a treated surface 302. In some embodiments, the passivation treatment 301 may passivate dangling bonds on the surfaces of the strained material 208, forming the treated surface 302. In some embodiments, the passivation treatment 301 may reduce the density of interface traps on the strained material 208. Passivating dangling bonds may reduce Fermi-level pinning, thus decreasing the resistivity of the second contact structure 306. In some embodiments, the treated surface 302 may include the dielectric sidewalls 220s and the strained material bottom 220b of the opening 220. In some embodiments, the treated surface 302 may also include the exposed surfaces of the ILD layer 218 and the gate stack 210. As shown in FIG. 14B, the passivation treatment 301 is performed on the exposed surfaces of the fins. In some embodiments, the treated surface 302 created by the passivation treatment 301 may have an appreciable thickness $t_3$ of between about 0.5 nm and 2 nm, such as about 1 nm.

The passivation treatment 301 may comprise an annealing process in some embodiments. The annealing process may comprise exposing the surfaces of the second semiconductor device 300 to a gas and then curing at a desired temperature and pressure. For example, the gas may be hydrogen ($H_2$), deuterium ($D_2$), or ammonia ($NH_3$), but any gas suitable for passivating surface dangling bonds could be used, and all are within the contemplated scope of this disclosure. In such a treatment, the annealing process (not shown in FIGS. 14A-14B) may comprise heating the second semiconductor device 300 to a temperature of between about 200° C. and about 800° C., for a time of between about 10 seconds and about 30 minutes. The pressure during annealing may be between about $1*10^{-4}$ torr and 2 atm, such as about 1 atm. The gas may be at a concentration at a level between about 1% and 100%.

In some embodiments, the passivation treatment 301 may comprise a high-pressure annealing (HPA) process. In such an embodiment, the annealing may take place at a much higher pressure, e.g., between about 2 atm and 30 atm, such as about 20 atm. The HPA process may be performed at a temperature of between about 300° C. and about 600° C., such as about 400° C., for a time of between about 10 minutes and about 2 hours, such as about 30 minutes.

Figure 15A:
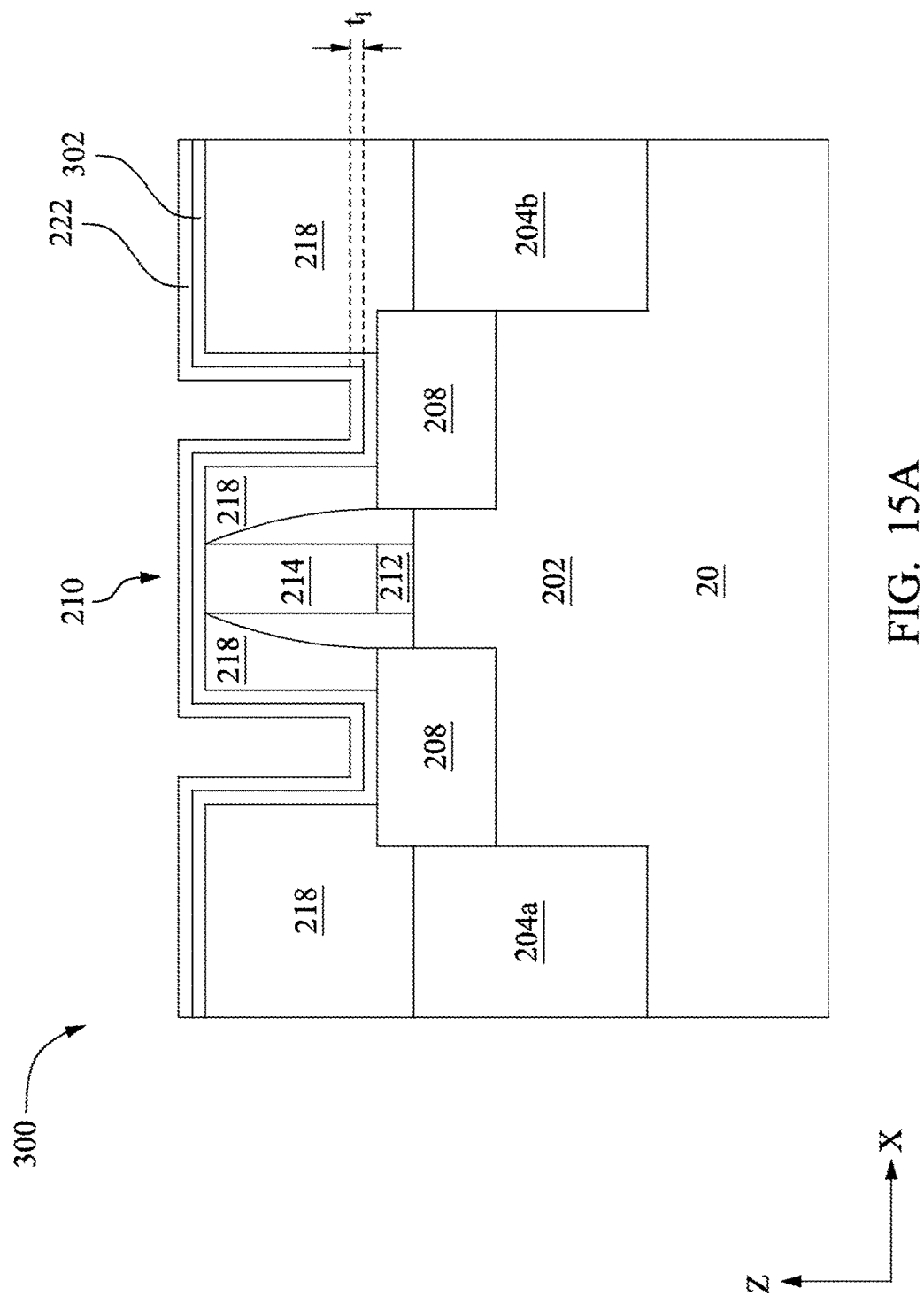
Figure 15B:
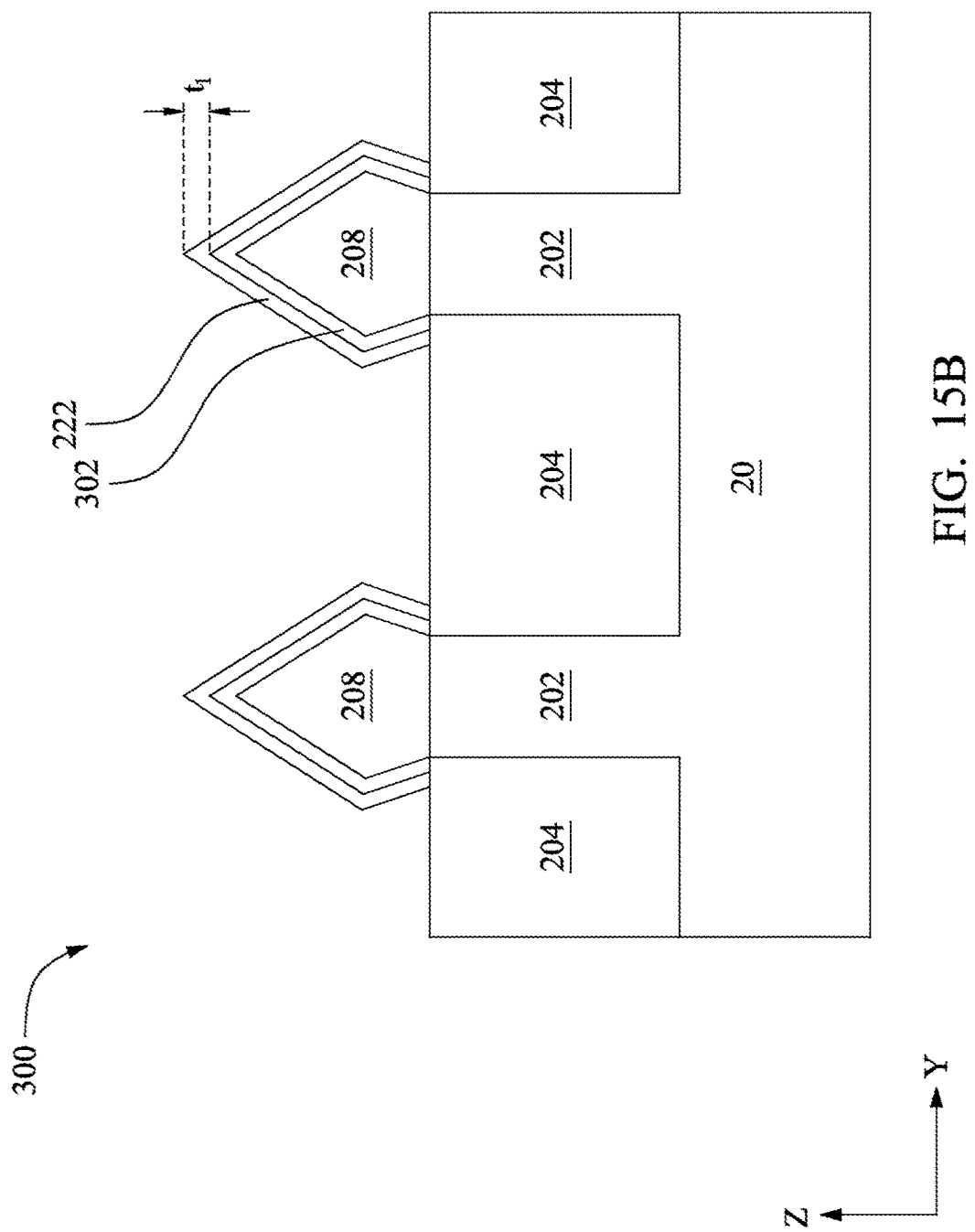
Figure 16A:
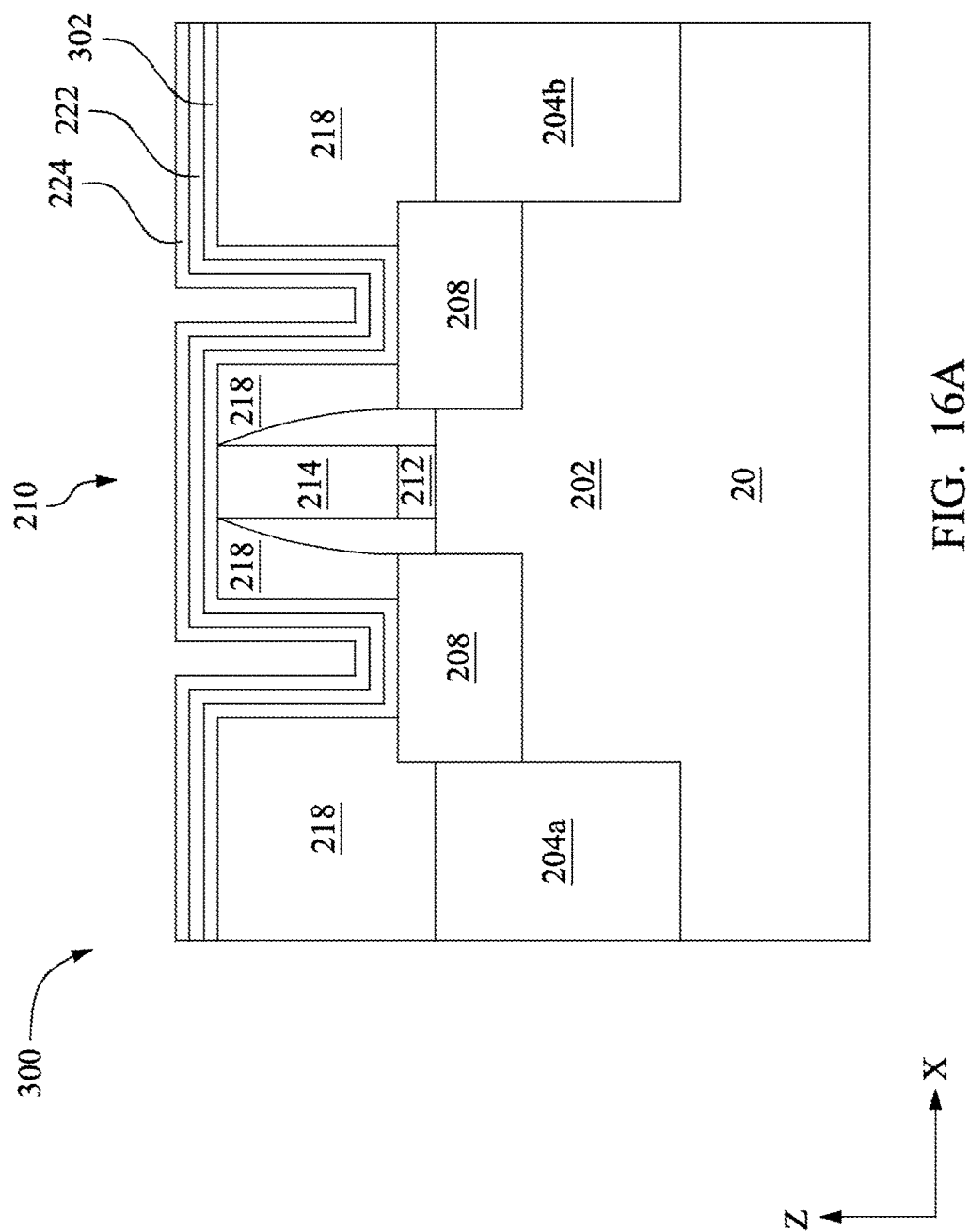
Figure 16B:
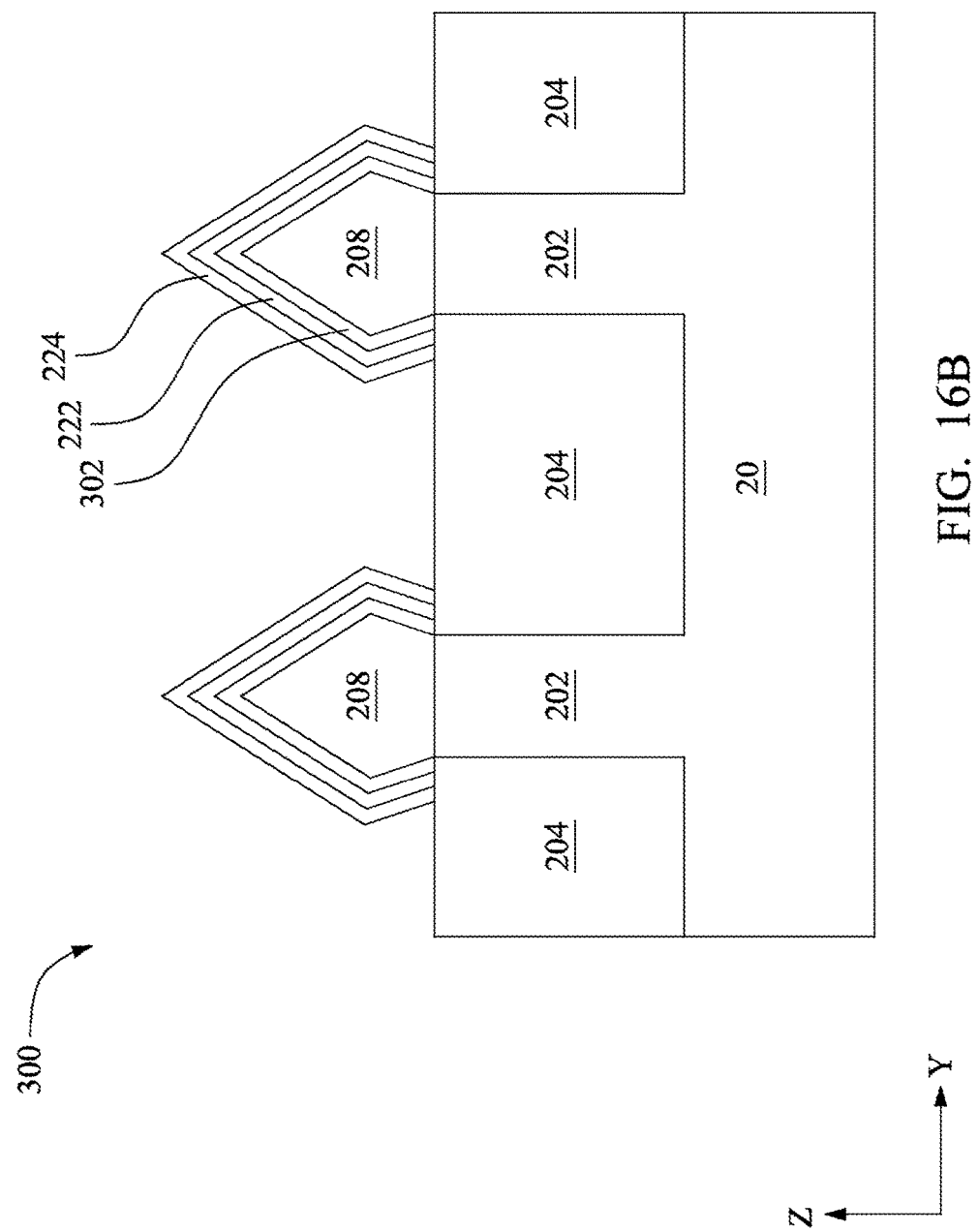

Referring now to FIGS. 15A-15B and step 1312 in FIG. 13, after performing the passivation treatment 301 on the opening 220 and strained material 208, the structure of FIGS. 15A-15B is produced by forming a first metal layer 222 on the treated surface 302. The first metal layer 222 may coat the interior of the opening 220 and extend over the ILD layer 218 and the gate stack 210. The first metal layer 222 is formed on the surfaces treated by passivation treatment 301. In some embodiments, the first metal layer 222 may comprise Ti, Al, Zr, Hf, Ta, In, Ni, Be, Mg, Ca, Y, Ba, Sr, Sc, or Ga, and may be formed using a method such as CVD, ALD or sputtering. In some embodiments, the first metal layer 222 has a first thickness $t_1$ ranging from about 1 nm to about 4 nm.

Figure 17A:
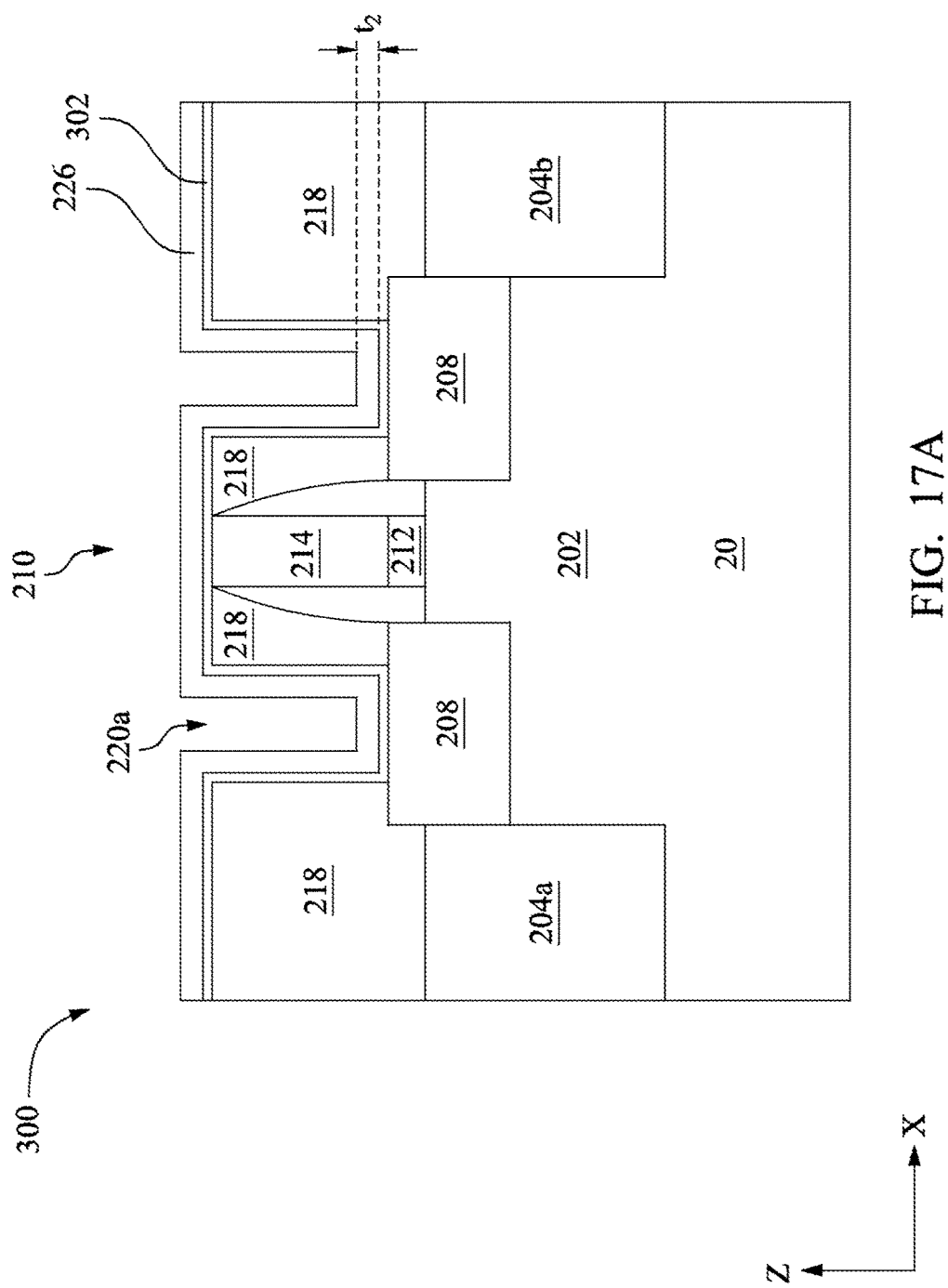
Figure 17B:
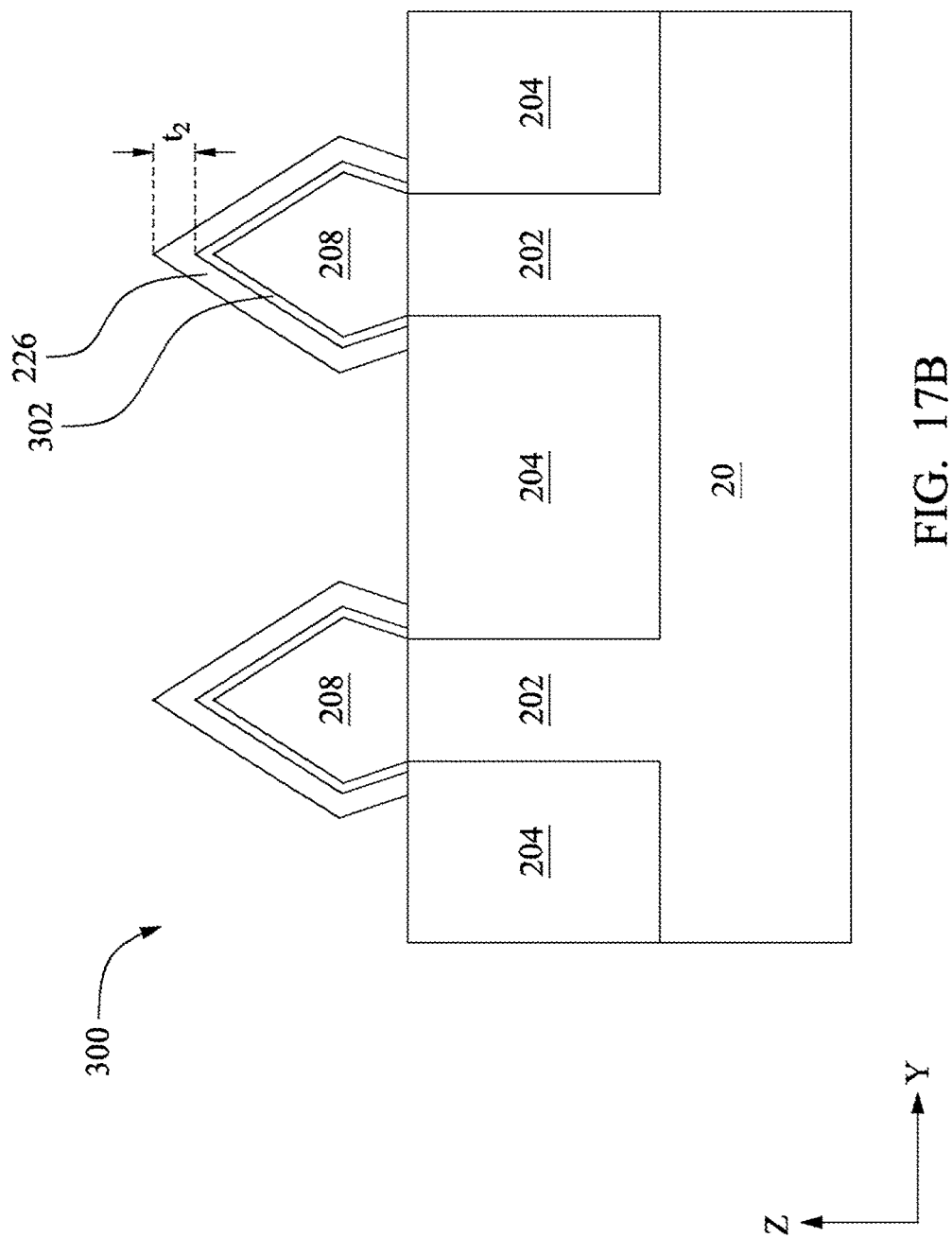

Referring now to FIGS. 16A-17B and step 1314 in FIG. 13, subsequent to the formation of the first metal layer 222, the structures in FIGS. 17A-17B are produced by treating the first metal layer 222 to form a conductive dielectric layer 226 over the strained material 208. In some embodiments, the step of treating the first metal layer 222 is first performed by exposing a surface of the first metal layer 222 to an oxygen-containing environment, such as air or a sealed chamber, under a pressure of about $1*10^{-10}$ Torr to about 760 Torr, resulting in a blanket adsorbed oxygen-containing film 224 formed over a surface of the first metal layer 222 (shown in FIGS. 16A-16B). In some embodiments, the oxygen-containing environment comprises $H_2O$, $O_2$, or $O_3$.

After exposing the surface of the first metal layer 222 to the oxygen-containing environment, the step of treating the first metal layer 222 further comprises exposing the surface of the first metal layer 222 to an inert gas, at a temperature of about 200° C. to about 800° C. In some embodiments, the inert gas comprises $N_2$, He, or Ar. In some embodiments, the blanket adsorbed oxygen-containing film 224 reacts with the first metal layer 222 in contact therewith to form the conductive dielectric layer 226 over the strained material 208. In some embodiments, the conductive dielectric layer 226 coats the interior of the opening 220 to form a coated opening 220a.

In some embodiments, the conductive dielectric layer 226 has a second thickness $t_2$ ranging from about 1 nm to about 10 nm. The relatively small thickness $t_2$ may give the conductive dielectric layer 226 its conductive property. By having such a small thickness, the conductive dielectric layer 226 may act to adjust the Fermi level at the interface of the second contact structure 306, creating a lower resistance. As such, the dielectric layer is referred to as the conductive dielectric layer 226. In some embodiments, the conductive dielectric layer 226 comprises TiO, $TiO_2$, $Ti_2O_3$, or $Al_2O_3$. In some embodiments, the conductive dielectric layer is selected from an oxide of the group consisting of Zr, Hf, Ta, In, Ni, Be, Mg, Ca, Y, Ba, Sr, Sc, Ga, and mixtures thereof. In some embodiments, the conductive dielectric layer 226 may reduce the fixed Schottky barrier height and serve as a low-resistance intermediate layer to replace high-resistance metal silicide, thereby enhancing the device performance.

Figure 18A:
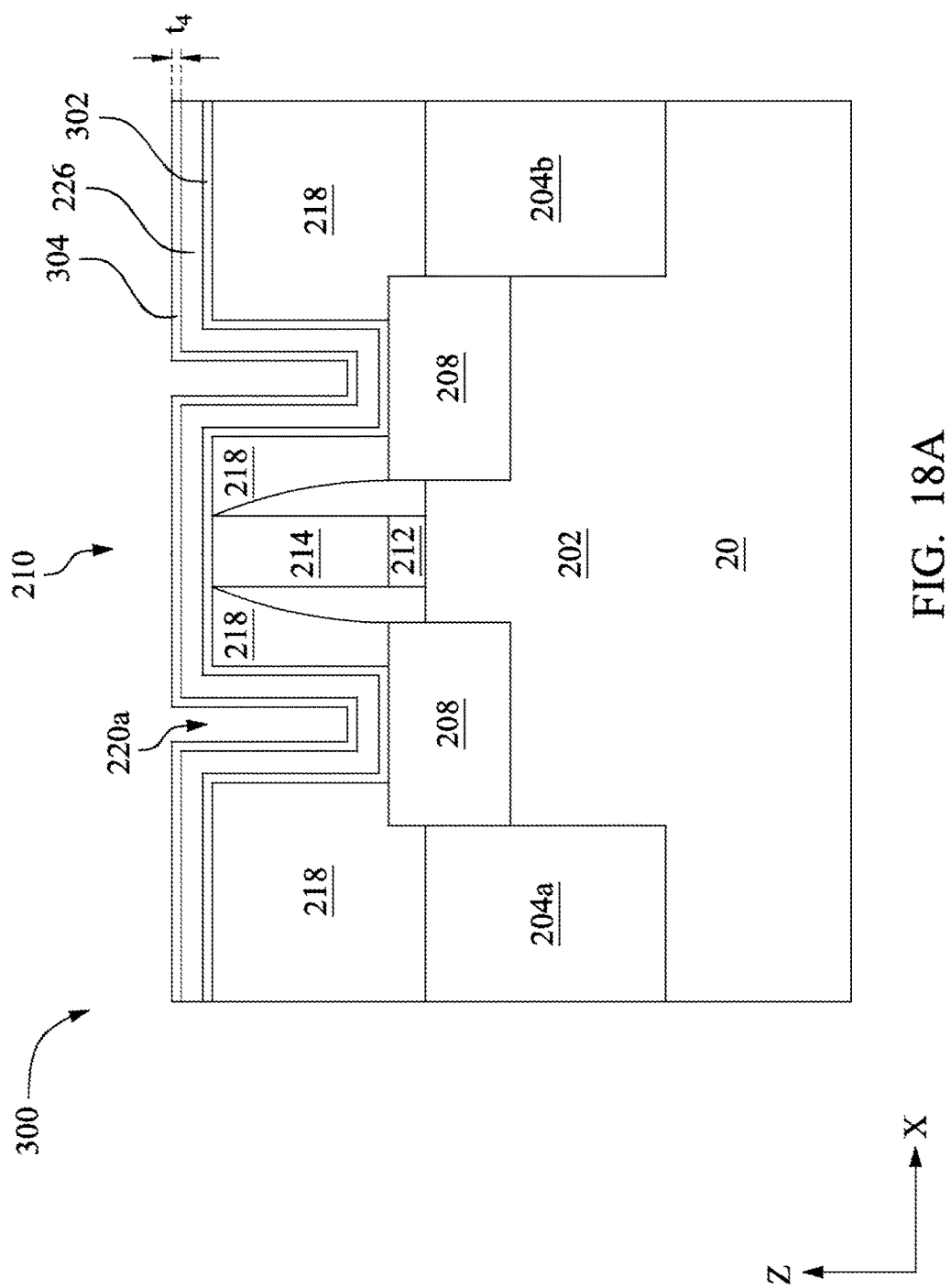
Figure 18B:
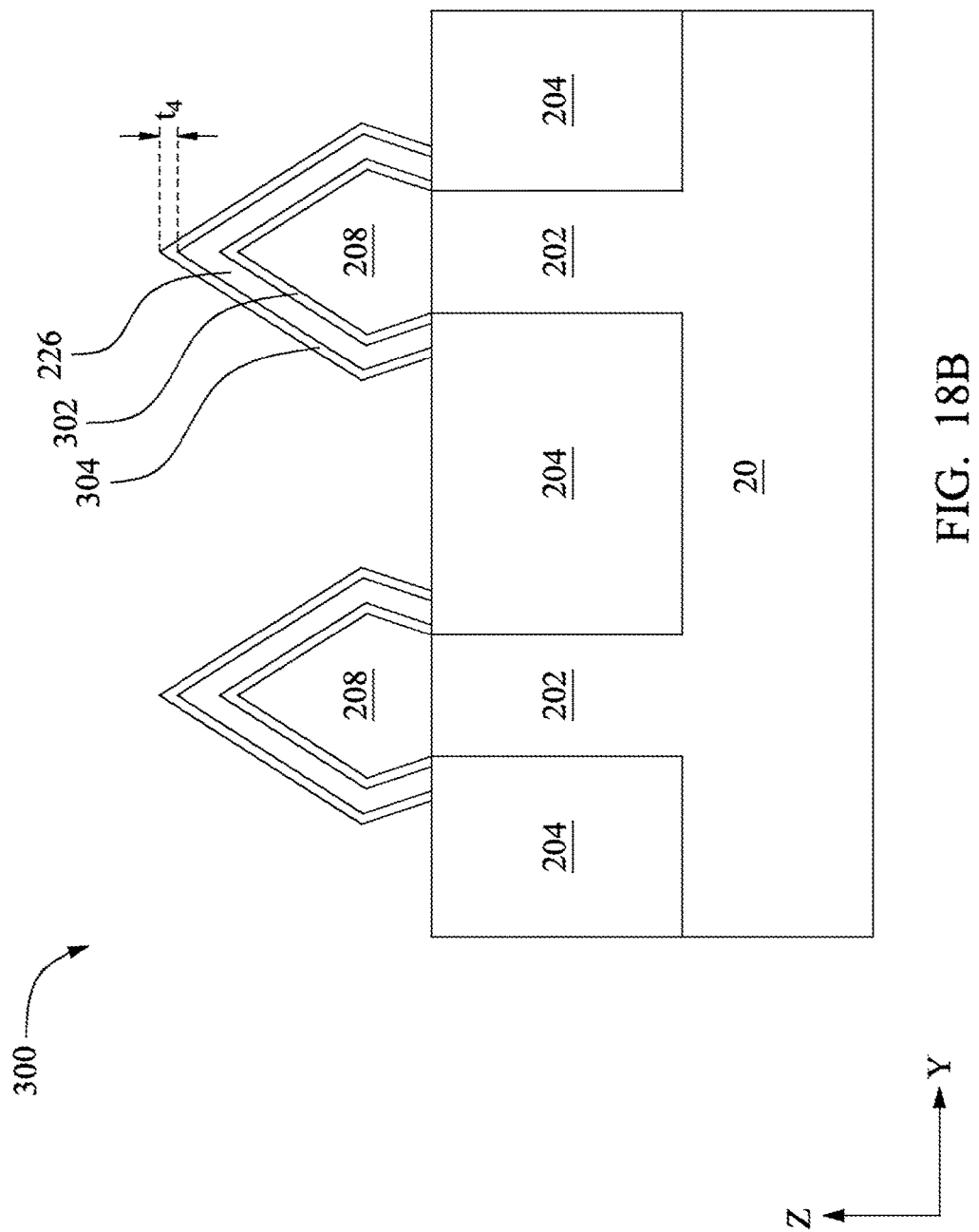

Referring now to FIGS. 18A-18B and step 1316 in FIG. 13, after the conductive dielectric layer 226 is formed the structures in FIGS. 18A-18B are produced by forming a metallic barrier 304 on top of the conductive dielectric layer 226. In one embodiment, the metal barrier 304 may be formed over the conductive dielectric layer 226. In some embodiments, the metallic barrier 304 comprises Ta. In other embodiments, the metallic barrier 304 may comprise Zn, Sn, Cd, In, or Ru. The metallic barrier 304 may be formed by CVD, PVD, plating, ALD, or other suitable technique. The metallic barrier 304 may have a thickness $t_4$ of between about 0.5 nm and 3 nm, such as about 2 nm.

The metallic barrier 304 may provide blocking capabilities to the conductive dielectric layer 226, preventing materials formed in subsequent steps (not illustrated in FIGS. 18A-18B) from diffusing into the conductive dielectric layer 226. This may increase the thermal stability of the second semiconductor device 300, reducing the Schottky barrier height of the conductive dielectric layer 226, and thus reducing the resistivity of the second contact structure 306.

Figure 19A:
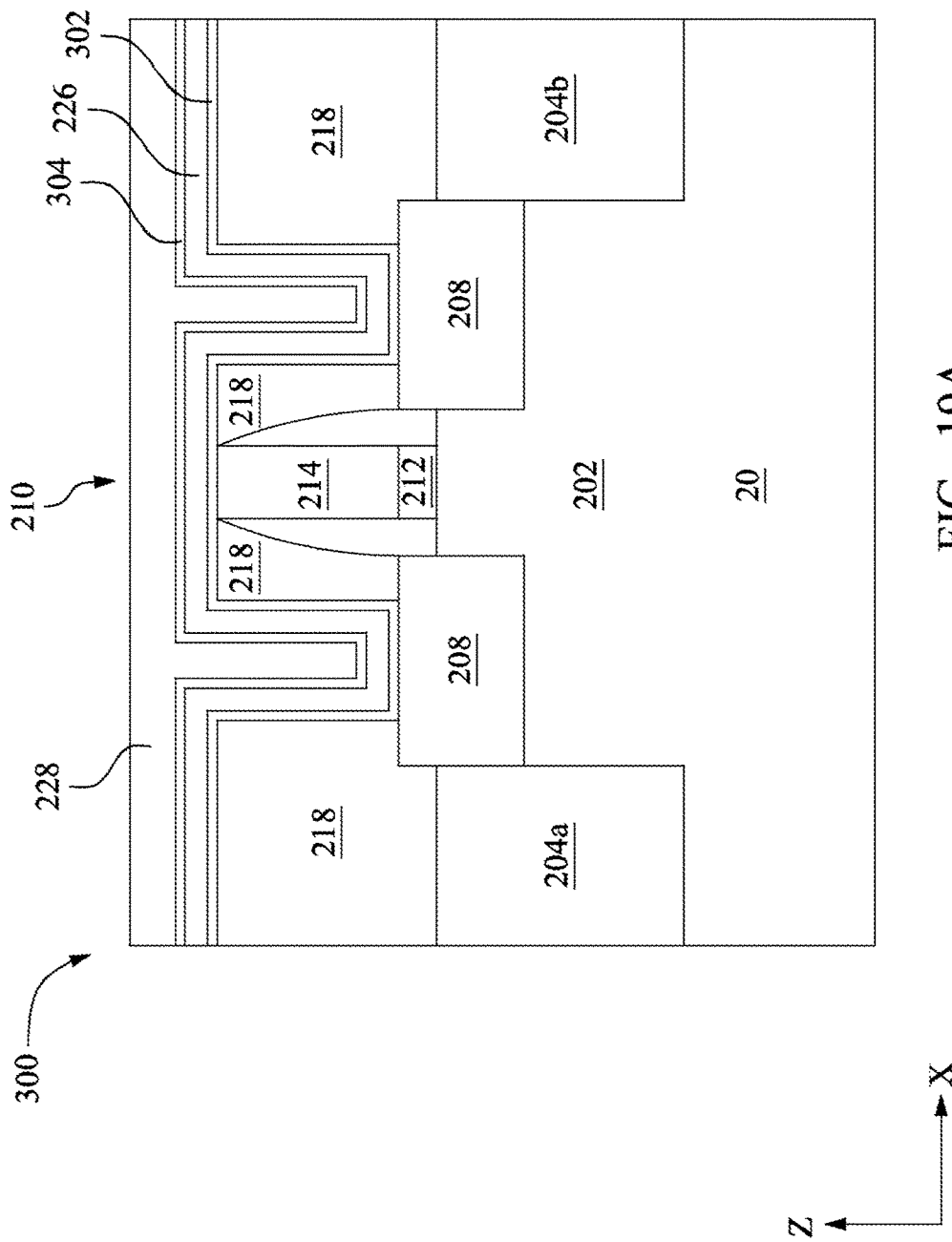
Figure 19B:
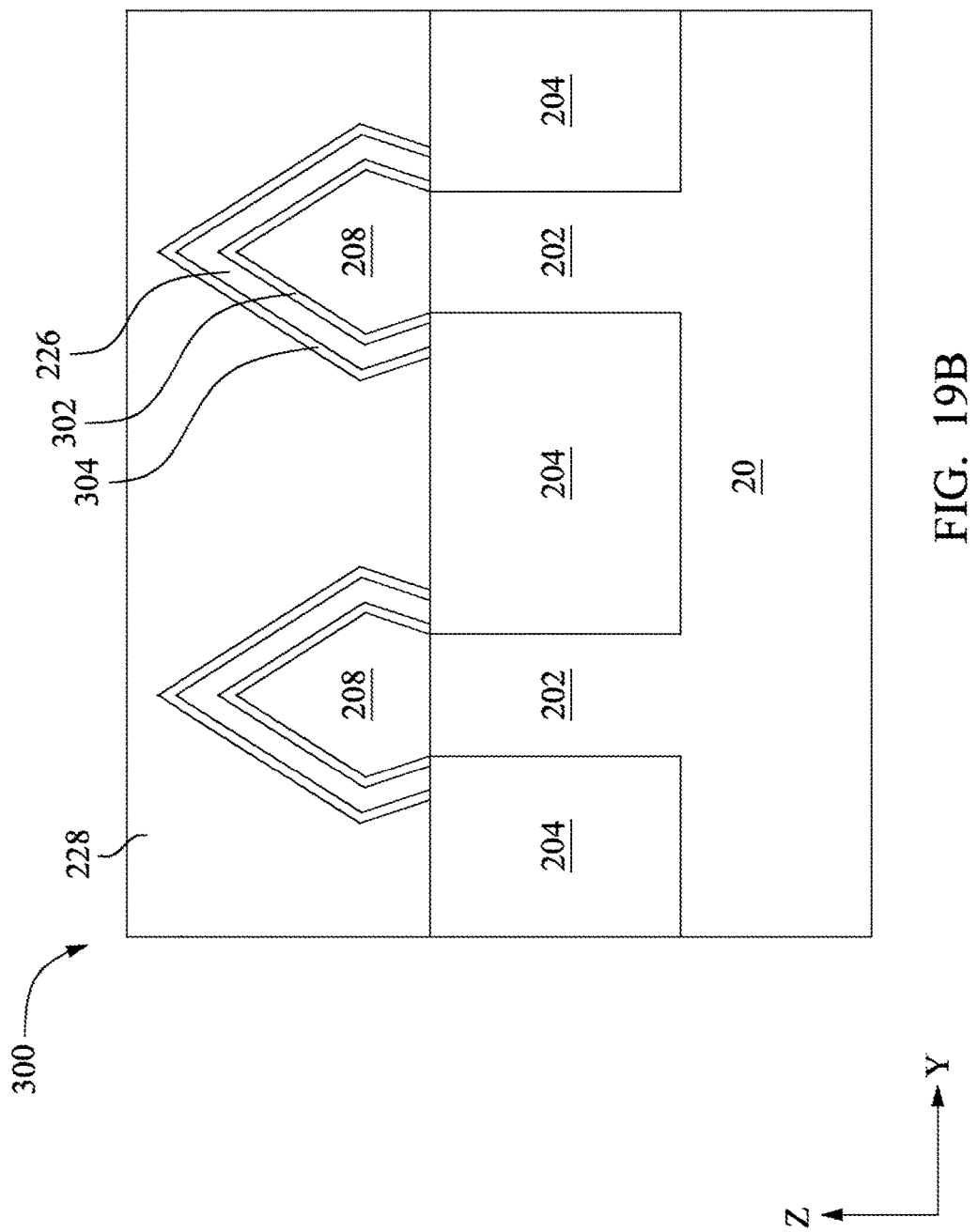

Referring now to FIGS. 19A-20B and step 1318 in FIG. 13, following formation of the metallic barrier 304, the structures in FIGS. 19A-19B are produced by forming a second metal layer 228 in the coated opening 220a. In the depicted embodiment, the second metal layer 228 is deposited over the metallic barrier 304 to fill the coated opening 220a (see FIGS. 18A-18B). In some embodiments, the second metal layer 228 comprises Ta, Ti, Hf, Zr, Ni, W, Co, Cu, or Al. In some embodiments, the second metal layer 228 may be formed by CVD, PVD, plating, ALD, or other suitable technique. In some embodiments, the second metal layer 228 may comprise a laminate, such as a barrier metal layer, a liner metal layer or a wetting metal layer. Further, the thickness of the second metal layer 228 will depend on the depth of the coated opening 220a. The second metal layer 228 is thus deposited until the coated opening 220a are substantially filled or over-filled.

Figure 20A:
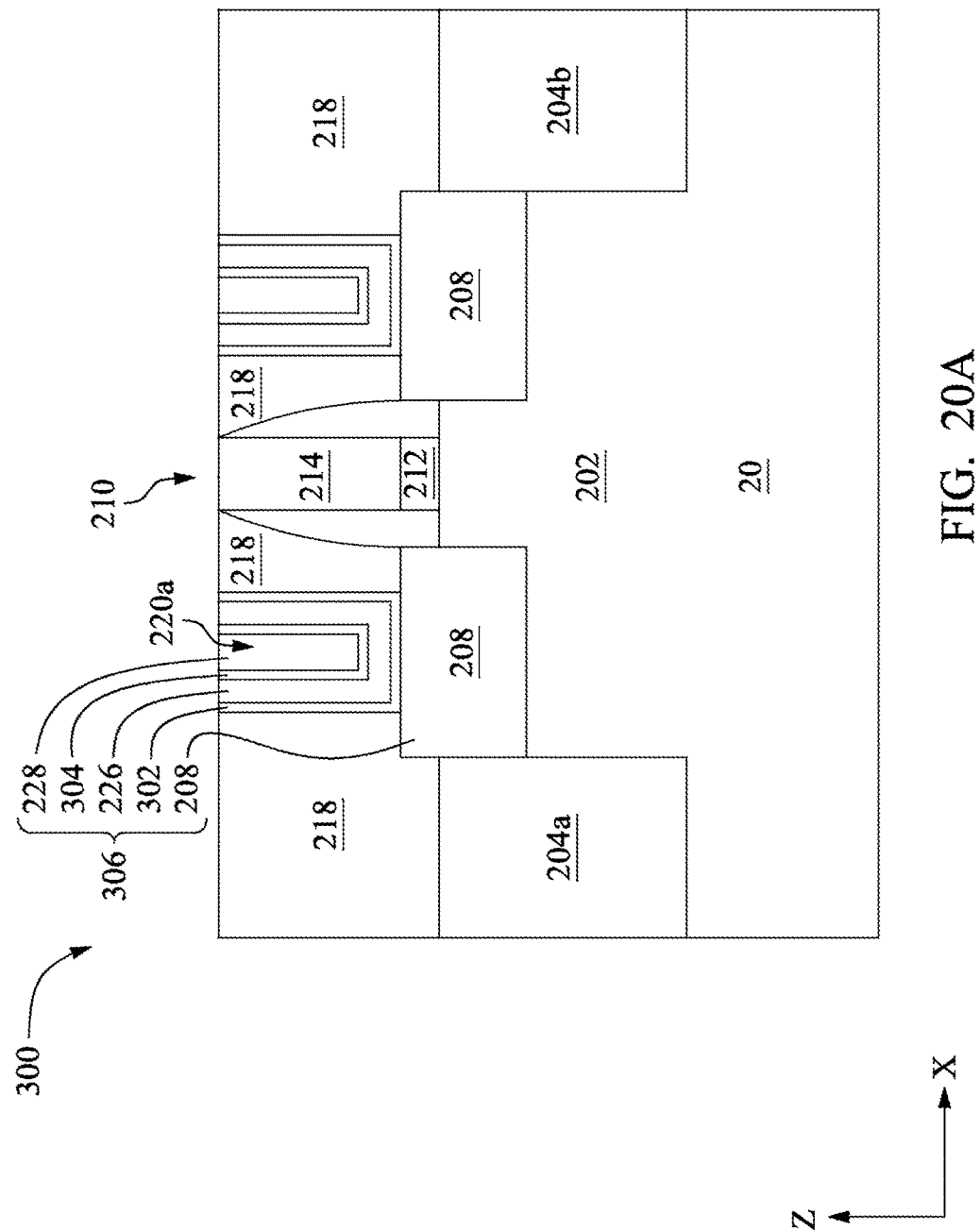
Figure 20B:
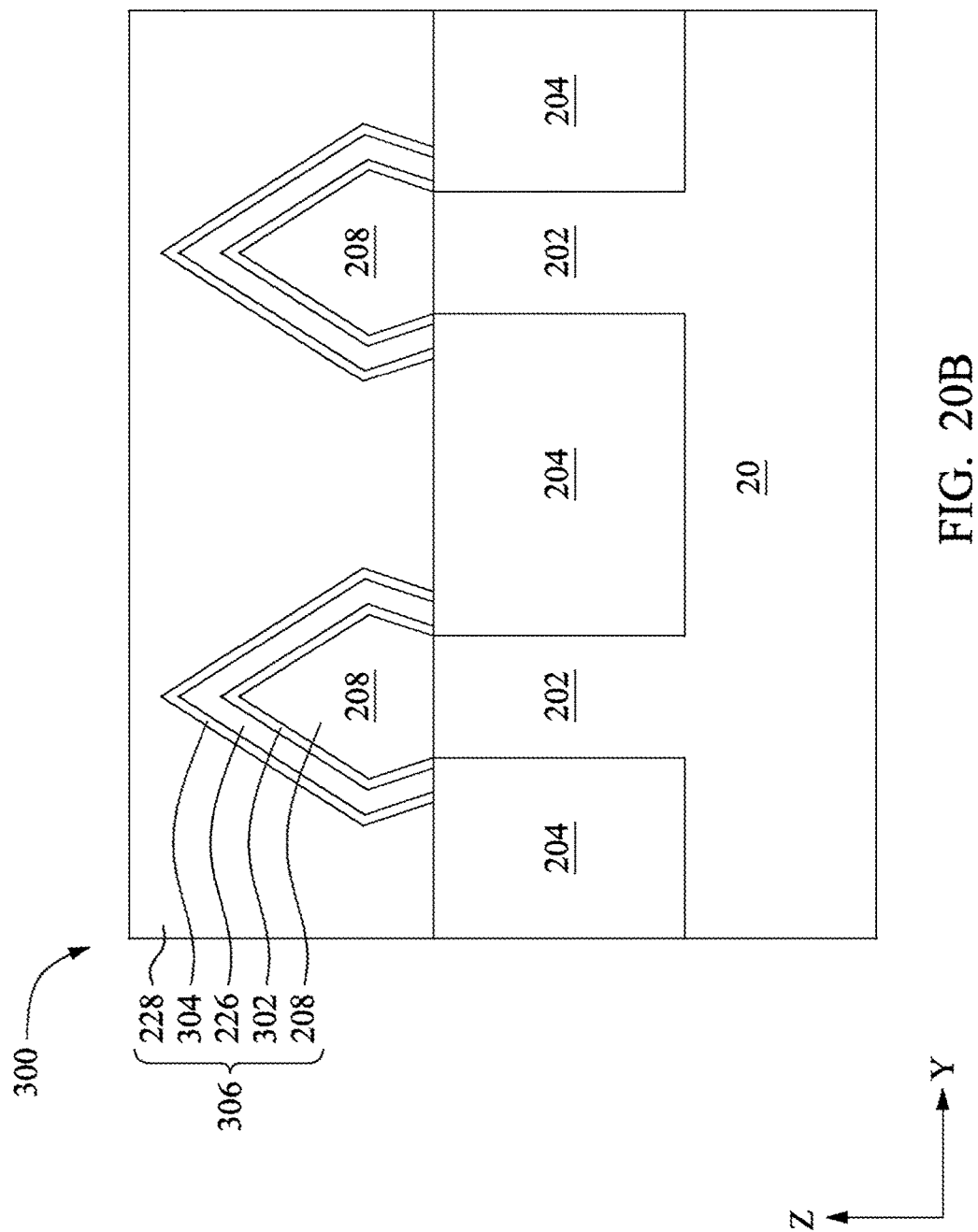

After forming the second metal layer 228, it is then planarized to produce the second contact structure 306 shown in FIGS. 20A-20B. The planarization process (not shown) may be, e.g., a chemical-mechanical planarization (CMP), but any other suitable process may be used. Since the planarization process removes a portion of the second metal layer 228 outside of the coated opening 220a, the CMP process may stop when reaching the ILD layer 218, thus providing a substantially planar surface.

In some embodiments, with respect to the examples depicted in FIGS. 14A-20B, the second semiconductor device 300 comprises the substrate 20 having the major surface 20s and the S/D trenches 206 extending below the major surface 20s (shown in FIG. 3); the strained material 208 filling the S/D trenches 206, wherein a lattice constant of the strained material 208 is different from a lattice constant of the substrate 20 (shown in FIG. 4); the inter-layer dielectric (ILD) layer 218 having the opening 220 over the strained material 208, wherein the opening 220 comprises dielectric sidewalls 220s and the strained material bottom 220b (shown in FIG. 7); a passivation treatment 301 (shown in FIGS. 14A-14B); a conductive dielectric layer 226 coating the dielectric sidewalls 220s and material bottom 220b of the opening 220, wherein the conductive dielectric layer 226 has the thickness $t_2$ (shown in FIGS. 17A-17B); a metal barrier 304 covering the conductive dielectric layer 226, wherein the metal barrier 302 has a thickness $t_4$ (shown in FIGS. 18A-18B); and the second metal layer 228 filling the coated opening 220a of the conductive dielectric layer 226 (shown in FIG. 12).

Figure 21:
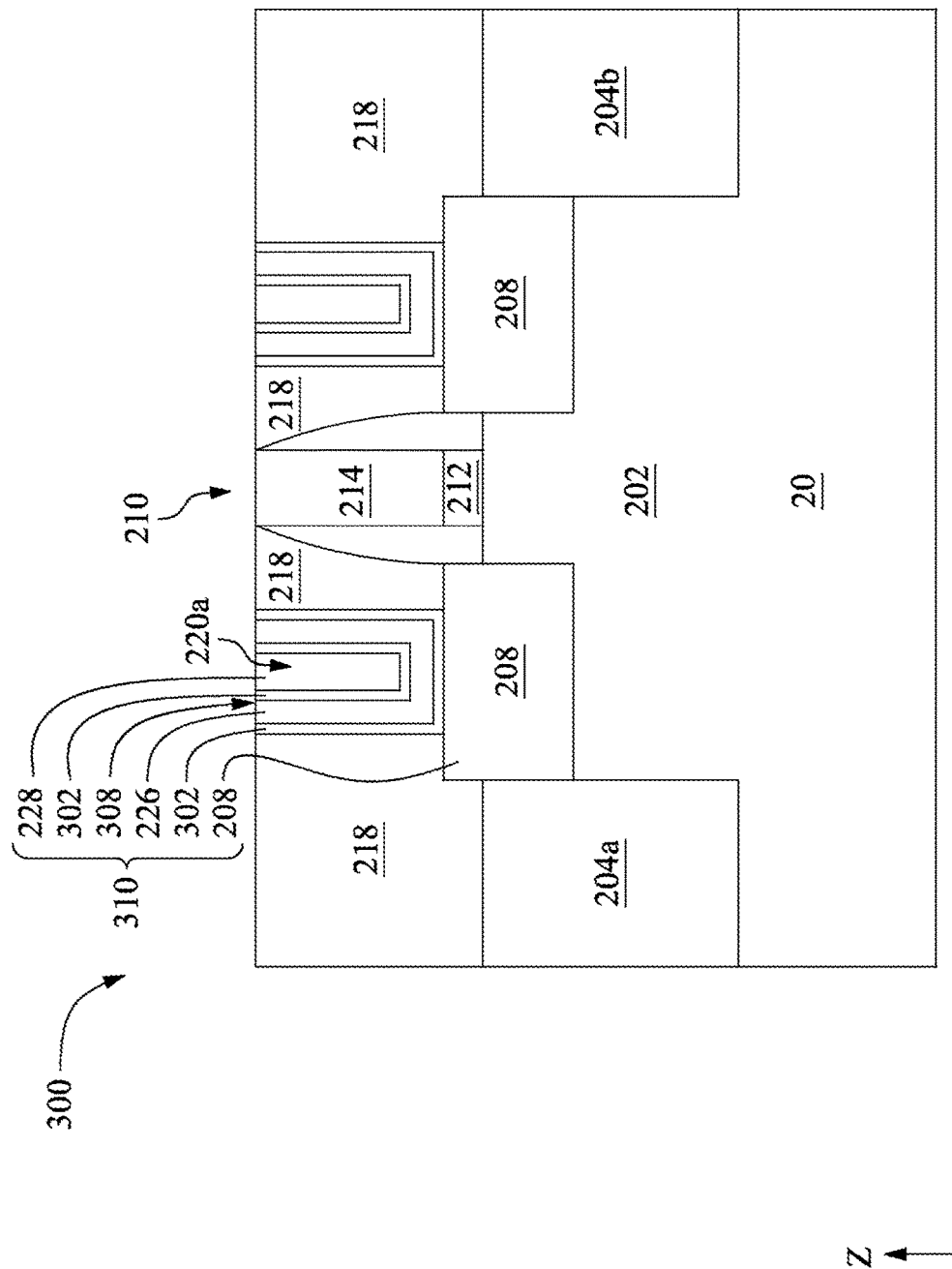
FIG. 21 is a schematic cross-sectional view of a semiconductor device comprising a low resistivity contact, in accordance with another embodiment.

Referring now to FIG. 21, another alternative embodiment of fabricating a low resistivity contact of a FinFET is shown, according to various aspects of the present disclosure. After formation of the metallic barrier 304 (shown in FIGS. 18A-18B), a metal cap interface 308 may be formed where the metallic barrier 304 interfaces the conductive dielectric layer 226. The metal cap interface 308 may form due to reactions between the conductive dielectric layer 226 and the metallic barrier 304 if heated above a certain temperature. This heating may occur in steps subsequent to the second method 1300, e.g., during back-end processing (not shown in FIG. 13, but discussed above). For example, when the conductive dielectric layer 226 comprises $TiO_2$ and the metallic barrier 304 comprises Ta, the metal cap interface 308 that forms between them may comprise $Ta_2O_5$, and form when heated to a temperature between about 350° C. and 600° C., such as about 400° C.

After the steps shown in FIG. 13 (and illustrated in FIGS. 14A-21) have been performed, subsequent processes such as interconnect processing may be performed to complete the second semiconductor device 300 fabrication. By performing the passivation treatment 301, the density of interface traps on the strained material 208 may be reduced. This may reduce Fermi level pinning, which avoids fixing of the Schottky barrier height and thereby further decreases the contact resistance of source and drain regions of the semiconductor device. This decreased contact resistance may increase the device performance. Additionally, by forming the metallic barrier 304 over the conductive dielectric layer 226, oxygen is prevented from gathering in and oxidizing the second metal layer 228 during subsequent steps such as back-end processing, which may also decrease the contact resistance and increase device performance.

In accordance with some embodiments, a method of forming a semiconductor device comprising providing a substrate having a fin, is provided. A strained material is epitaxially grown in source/drain regions of the fin. An inter-layer dielectric (ILD) layer is formed over the substrate. An opening in the ILD layer is formed to expose the strained material. An exposed portions of the strained material is passivated to form a treated surface. A conductive dielectric layer is formed over the treated surface. A barrier metal layer is formed over the conductive dielectric layer. Finally, a metallic contact plug is formed over the barrier layer in the opening in the ILD layer.

In accordance with some embodiments, a method of forming a semiconductor comprising forming a gate stack on a surface of a substrate, is provided. A trench is formed in the substrate adjacent to the gate stack. A strained material is formed in the trench. An inter-layer dielectric (ILD) layer is formed over the substrate. A contact structure is formed, wherein forming the contact structure comprises forming an opening in the ILD layer to expose the strained material. The strained material is treated to form a passivation layer. A conductive dielectric layer is formed over the passivation layer. A metallic barrier is formed over the conductive dielectric layer. Finally a metallic layer is formed over the metallic barrier, wherein an upper surface of the metallic layer is coplanar with an upper surface of the ILD layer.

In accordance with some embodiments a fin on a substrate is provided. A gate electrode is over the fin. Source/drain regions are in the fin on opposing sides of the gate electrode, wherein the source/drain regions comprise a material having a lattice constant different from a lattice constant of the substrate, and wherein the source/drain regions comprise a passivated treatment layer. An inter-layer dielectric (ILD) layer having an opening is over the passivated treatment layer of the source/drain regions. A conductive dielectric layer is along the sidewalls of the opening and a surface of the passivated treatment layer. A metallic barrier is over the conductive dielectric layer. Finally, a metal layer fills the opening in the ILD layer.

In accordance with some embodiments a semiconductor device is provided. The semiconductor device includes a fin on a substrate, a gate electrode over the fin, and source/drain regions in the fin on opposing sides of the gate electrode, wherein the source/drain regions include a material having a lattice constant different from a lattice constant of the substrate, and wherein the source/drain regions include a passivated treatment layer. The semiconductor device further includes an inter-layer dielectric (ILD) layer having an opening over the passivated treatment layer of the source/drain regions, a conductive dielectric layer along sidewalls of the opening and a surface of the passivated treatment layer. A metallic barrier is over the conductive dielectric layer, and a metal layer fills the opening in the ILD layer.

In accordance with some embodiments a semiconductor device is provided. The semiconductor device includes a fin on a substrate, a gate electrode over the fin, source/drain regions in the fin on opposing sides of the gate electrode, wherein the source/drain regions includes a material having a lattice constant different from a lattice constant of the substrate, and an inter-layer dielectric (ILD) layer over the source/drain regions. A contact structure extends through the ILD layer to the source/drain regions. The contact structure includes a passivated layer on the source/drain regions and one or more conductive layers over the passivated layer.

In accordance with some embodiments a semiconductor device is provided. The semiconductor device includes a fin on a substrate, a gate electrode over the fin, a first source/drain region and a second source/drain region in the fin on opposing sides of the gate electrode, wherein the first source/drain region and the second source/drain region include an epitaxial material, the epitaxial material having a lattice constant different from a lattice constant of an immediately underlying material. An inter-layer dielectric (ILD) layer extends over the gate electrode the first source/drain region and the second source/drain region. A conductive fill extends into the ILD and electrically coupled to the first source/drain region, a passivated layer interposed between the epitaxial material and the conductive fill, a conductive dielectric layer interposed between the conductive fill and the passivated layer, the conductive dielectric layer being interposed between the conductive fill and the ILD, and a metallic barrier interposed between the conductive dielectric layer and the conductive fill.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate, the substrate comprising a semiconductor material;
   a dielectric layer over the substrate, the dielectric layer having an opening, the semiconductor material being exposed in the opening;
   a metal oxide layer coating sidewalls and a bottom of the opening, wherein the metal oxide layer has a thickness ranging from 1 nm to 10 nm, wherein the metal oxide layer directly contacts the semiconductor material; and
   a metal layer in the opening over the metal oxide layer.

2. The device of claim 1, wherein the semiconductor material comprises an epitaxial source/drain region, and wherein the metal oxide layer is over the epitaxial source/drain region.

3. The device of claim 2, wherein the epitaxial source/drain region have an upper surface higher than an upper surface of the substrate below a gate structure.

4. The device of claim 2, wherein the epitaxial source/drain region have a lattice constant different than an underlying semiconductor material.

5. The device of claim 1, wherein the metal oxide layer comprises an oxide of Ti, Al, Zr, Hf, Ta, In, Ni, Be, Mg, Ca, Y, Ba, Sr, Sc, or Ga.

6. The device of claim 1, wherein the dielectric layer comprises silicon oxide, silicon nitride, silicon oxynitride, phosphosilicate glass (PSG), borophosphosilicate glass (BPSG), spin-on glass (SOG), fluorinated silica glass (FSG), carbon doped silicon oxide and/or combinations thereof.

7. The device of claim 1, wherein the metal layer comprises Ta, Ti, Hf, Zr, Ni, W, Co, Cu, or Al.

8. A device comprising:
a substrate comprising a semiconductor conductive region;
a gate stack on the substrate;
a dielectric layer having an opening over the semiconductor conductive region, wherein the opening comprises sidewalls and a bottom, the bottom of the opening comprising the semiconductor conductive region;
a metal oxide layer coating the sidewalls and bottom of the opening, the metal oxide layer directly contacting the semiconductor conductive region; and
a metal layer over the metal oxide layer, the metal layer extending into the opening in the dielectric layer.

9. The device of claim 8, wherein the semiconductor conductive region comprises a semiconductor layer disposed in a recess of a semiconductor substrate.

10. The device of claim 9, wherein a lattice constant of the semiconductor layer is different than a lattice constant of the semiconductor substrate.

11. The device of claim 10, wherein the semiconductor layer extends above an uppermost surface of the semiconductor substrate.

12. The device of claim 8, wherein a thickness of the metal oxide layer is less than 10 nm.

13. The device of claim 8, wherein the metal oxide layer comprises an oxide of Ti, Al, Zr, Hf, Ta, In, Ni, Be, Mg, Ca, Y, Ba, Sr, Sc, or Ga.

14. The device of claim 8, wherein the metal oxide layer comprises TiO, $TiO_2$, or $Ti_2O_3$.

15. A device comprising:
a semiconductor substrate;
a gate structure over the semiconductor substrate;
a strained semiconductor material on opposing sides of the gate structure;
a dielectric layer over the semiconductor substrate and the strained semiconductor material, the dielectric layer having an opening over the strained semiconductor material;
a metal oxide layer on sidewalls and a bottom of the opening, the metal oxide layer directly contacting the strained semiconductor material; and
a metal layer in the opening, wherein the metal oxide layer is interposed between the metal layer and the strained semiconductor material.

16. The device of claim 15, wherein the metal oxide layer has a thickness of 1 nm to 10 nm along the bottom of the opening.

17. The device of claim 15, wherein the metal oxide layer completely separates the metal layer from the dielectric layer.

18. The device of claim 15, wherein the strained semiconductor material is raised above an uppermost surface of the semiconductor substrate.

19. The device of claim 18, further comprising spacers adjacent the gate structure, wherein the strained semiconductor material extends along a sidewall of the spacers.

20. The device of claim 15, wherein the metal oxide layer comprises an oxide of Ti, Al, Zr, Hf, Ta, In, Ni, Be, Mg, Ca, Y, Ba, Sr, Sc, or Ga.

* * * * *